(12) United States Patent
Liu et al.

(10) Patent No.: US 12,451,354 B2
(45) Date of Patent: Oct. 21, 2025

(54) DOUBLE PATTERNING METHOD OF PATTERNING A SUBSTRATE

(71) Applicant: Tokyo Electron Limited, Tokyo (JP)

(72) Inventors: Eric Chih-Fang Liu, Albany, NY (US); Katie Lutker-Lee, Albany, NY (US); Steven Grzeskowiak, Albany, NY (US); Jodi Grzeskowiak, Schenectady, NY (US); Jeffrey Smith, Albany, NY (US); David L. O'Meara, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 511 days.

(21) Appl. No.: 17/941,331

(22) Filed: Sep. 9, 2022

(65) Prior Publication Data

US 2024/0087892 A1    Mar. 14, 2024

(51) Int. Cl.
*H01L 21/033* (2006.01)
*H01L 21/027* (2006.01)
(Continued)

(52) U.S. Cl.
CPC ...... *H01L 21/0337* (2013.01); *H01L 21/0276* (2013.01); *H01L 21/0332* (2013.01); *H01L 21/31144* (2013.01); *H01L 21/32139* (2013.01)

(58) Field of Classification Search
CPC ............. H01L 21/0332; H01L 21/0337; H01L 21/0276; H01L 21/31144; H01L 21/32139
See application file for complete search history.

(56) References Cited

U.S. PATENT DOCUMENTS 9,818,611 B2    11/2017   deVilliers
9,941,164 B1    4/2018    Kim
(Continued)

FOREIGN PATENT DOCUMENTS

CN    112017950 A    12/2020

OTHER PUBLICATIONS

Liu, Eric et al., "Line Edge Roughness (LER) Reduction Strategies for EUV Self-Aligned Double Patterning (SADP)," Proceedings vol. 11615, Advanced Etch Technology and Process Integration for Nanopatterning X, Apr. 9, 2021, 11 pages.
(Continued)

*Primary Examiner* — Walter H Swanson
(74) *Attorney, Agent, or Firm* — Slater Matsil, LLP

(57) ABSTRACT

A method of forming a semiconductor device includes forming, over a hardmask layer and an underlying layer of a substrate, a pattern of first trenches between adjacent template lines, each of the first trenches exposing a portion of the hardmask layer, and each of the template lines including a mandrel and spacers on sidewalls of the mandrel; forming a pattern of first blocks over the pattern of the first trenches and the template lines, the first blocks dividing the first trenches to form a pattern of first stencil trenches; transferring the pattern of first stencil trenches to the hardmask layer to form a pattern of first hardmask trenches, each of the first hardmask trenches exposing a portion of the underlying layer; forming a first fill layer filling the first hardmask trenches and exposing the mandrels; selectively removing the mandrels to form second trenches, each of the second trenches exposing a portion of the hardmask layer; and forming a conformal liner in the second trenches and over a surface of the spacers, a surface of the first blocks, and a surface of the first fill layer to form third trenches.

16 Claims, 17 Drawing Sheets

(51) Int. Cl.
      *H01L 21/311*       (2006.01)
      *H01L 21/3213*     (2006.01)

(56) References Cited

U.S. PATENT DOCUMENTS

| | | |
|---|---|---|
| 10,020,196 B2 | 7/2018 | deVilliers |
| 10,083,842 B2 | 9/2018 | deVilliers et al. |
| 10,103,032 B2 | 10/2018 | deVilliers |
| 10,115,726 B2 | 10/2018 | Kang et al. |
| 10,192,743 B2 | 1/2019 | Sherpa et al. |
| 10,332,744 B2 | 6/2019 | deVilliers et al. |
| 10,366,890 B2 | 7/2019 | deVilliers et al. |
| 2016/0307768 A1 | 10/2016 | Chen et al. |
| 2018/0082852 A1* | 3/2018 | Xie .................. H10D 84/038 |
| 2018/0323067 A1 | 11/2018 | Shu et al. |
| 2020/0135542 A1 | 4/2020 | Felix et al. |

OTHER PUBLICATIONS

International Search Report and Written Opinion, PCT Application No. PCT/US2023/031073, mailed Dec. 15, 2023, 8 pages.

Zahlten, C., et al., "High-NA EUV lithography: pushing the limits", Proc. SPIE 11177, 35th European Mask and Lithography Conference (EMLC 2019), 111770B (Aug. 29, 2019), https://doi.org/10.1117/12.2536469, abstract only, 5 pages.

\* cited by examiner

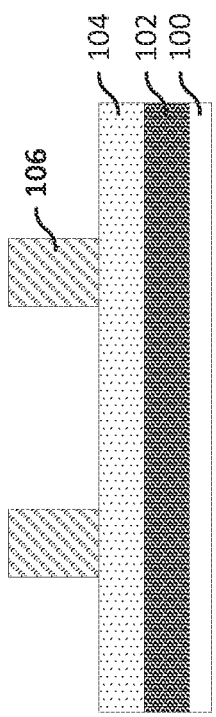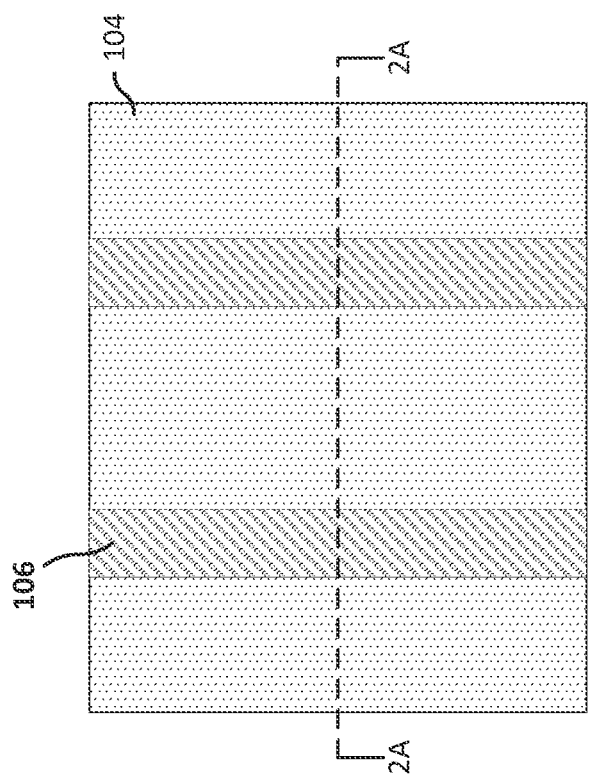
FIGURE 2A
FIGURE 2B
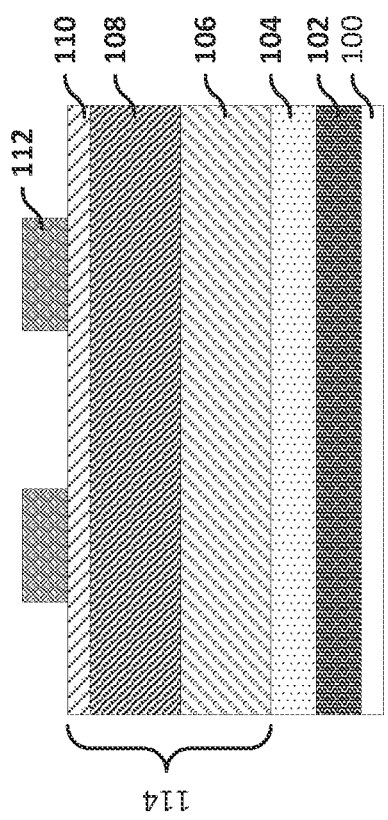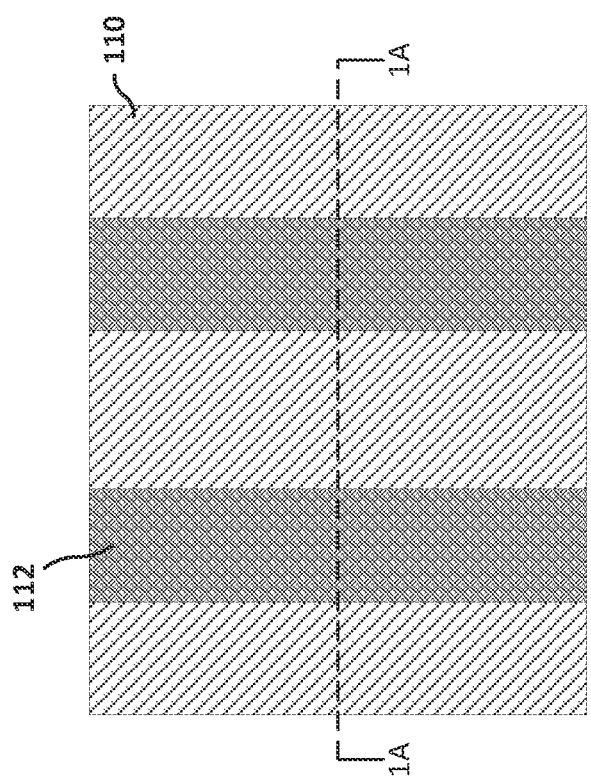
FIGURE 1A
FIGURE 1B

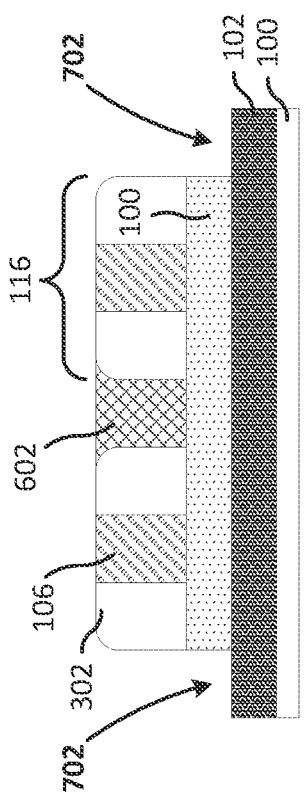
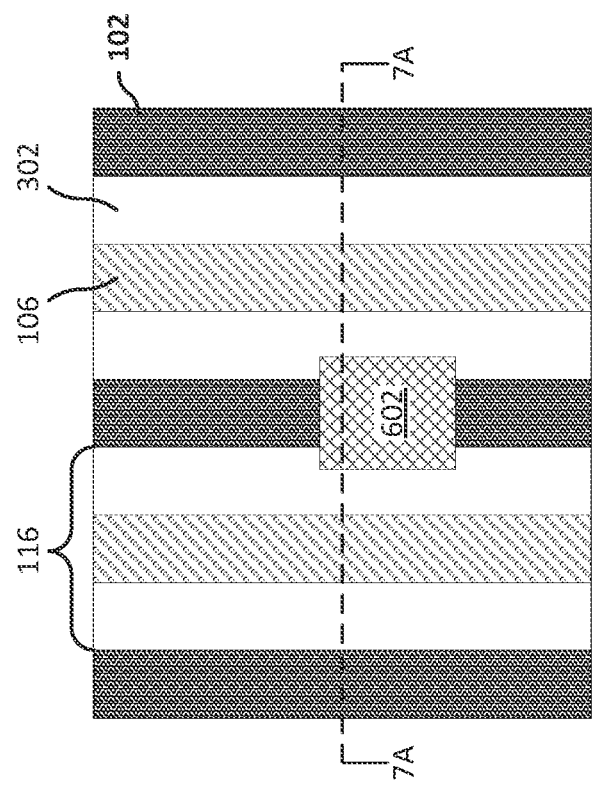
FIGURE 7A
FIGURE 7B
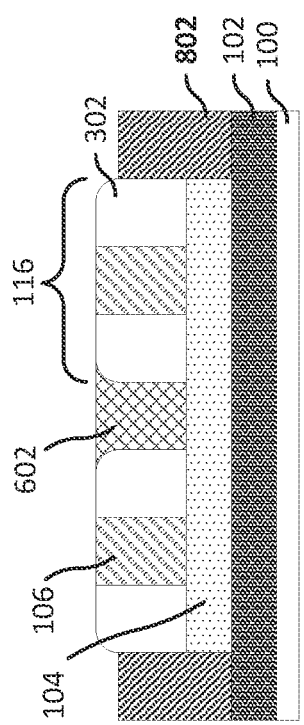
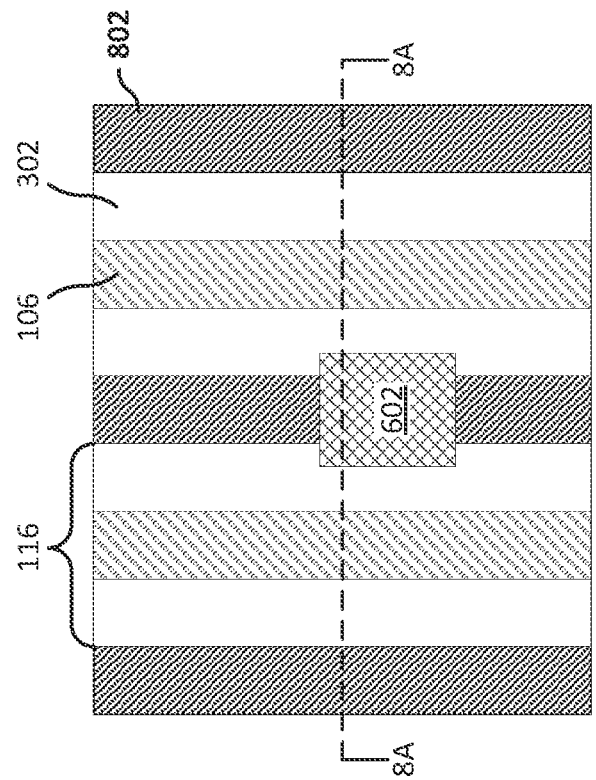
FIGURE 8A
FIGURE 8B

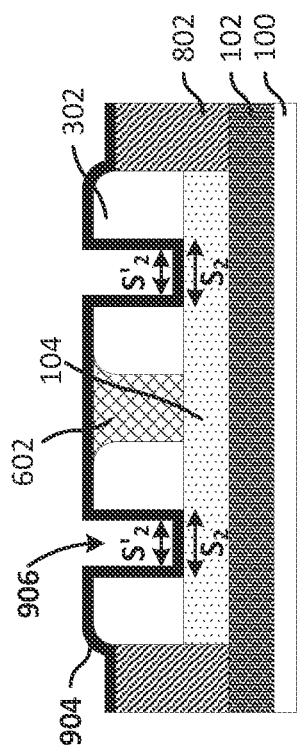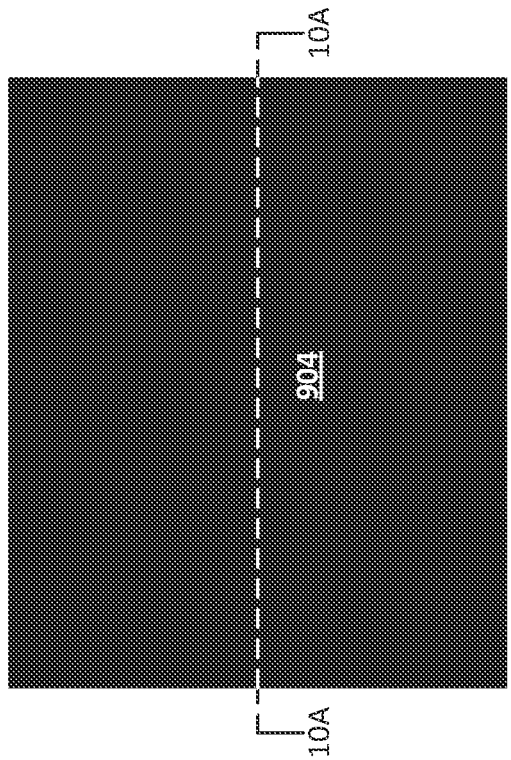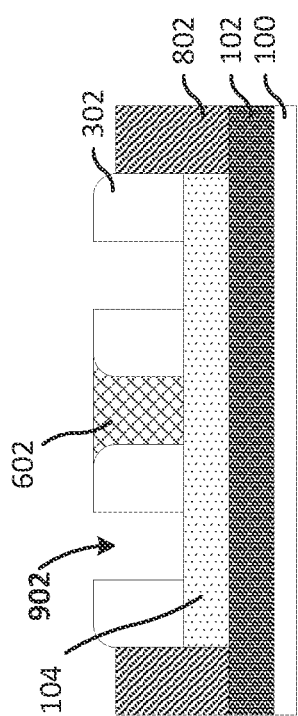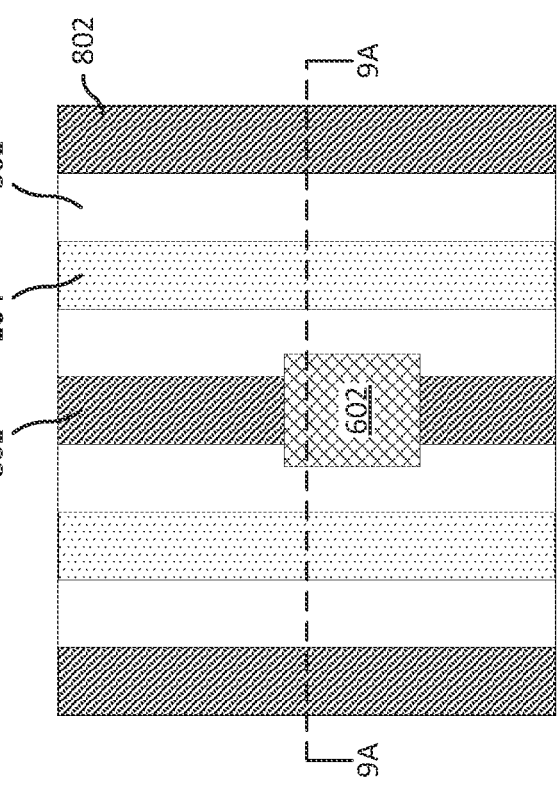
FIGURE 9A
FIGURE 9B
FIGURE 10A
FIGURE 10B

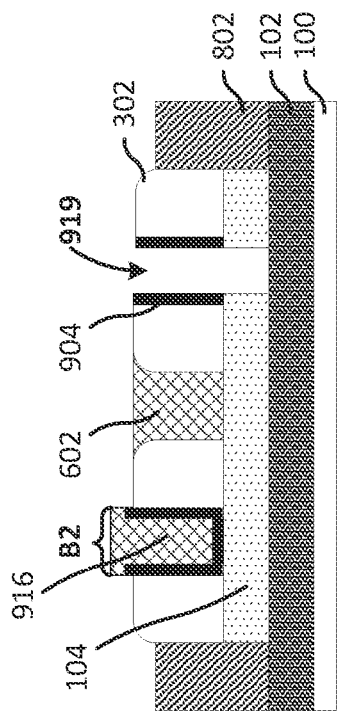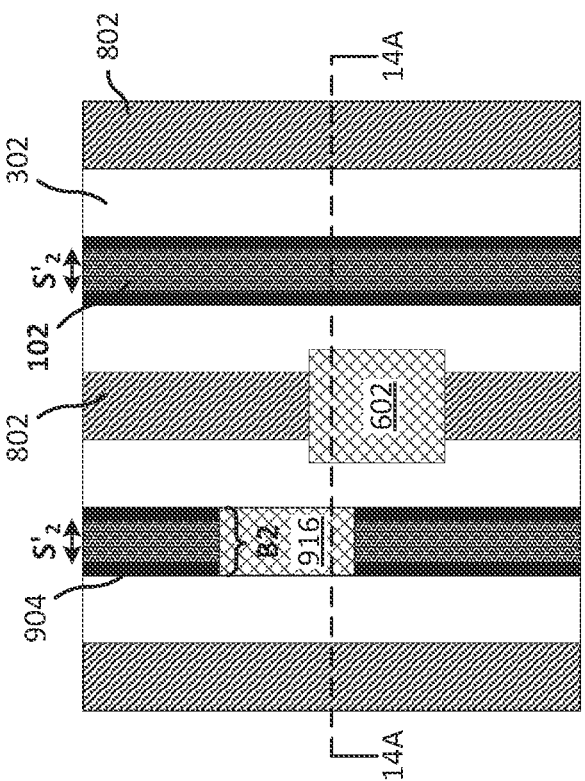
FIGURE 14A
FIGURE 14B
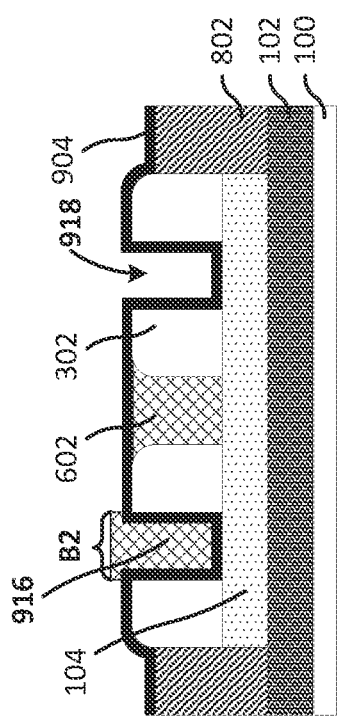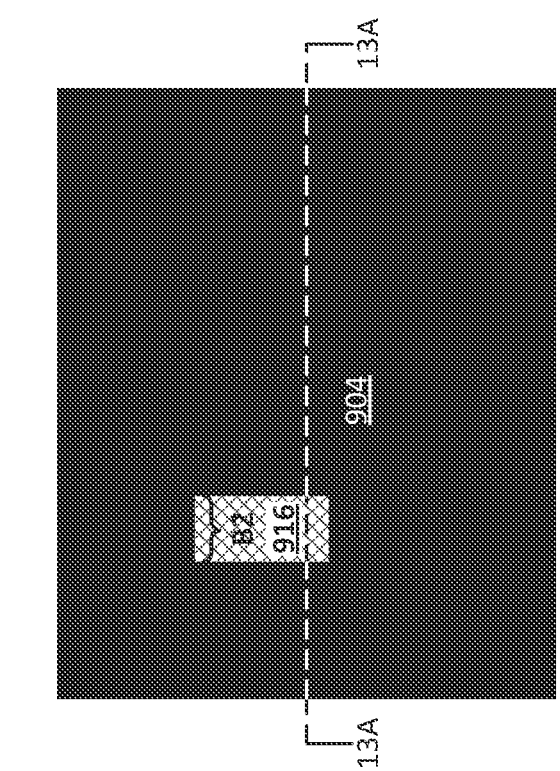
FIGURE 13A
FIGURE 13B

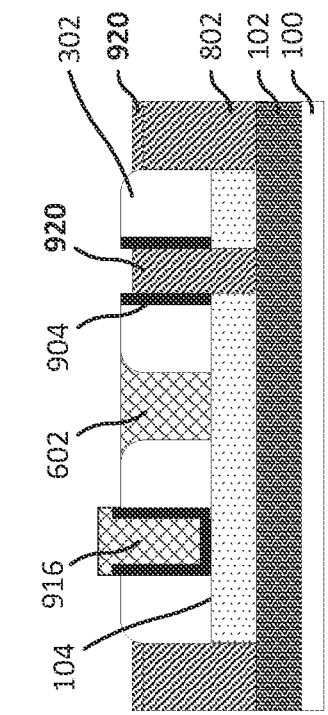
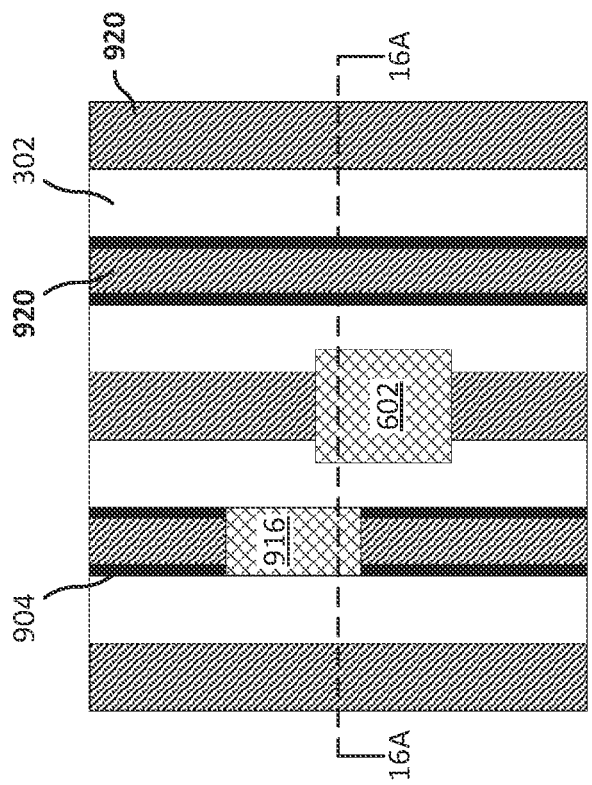
FIGURE 15A
FIGURE 15B
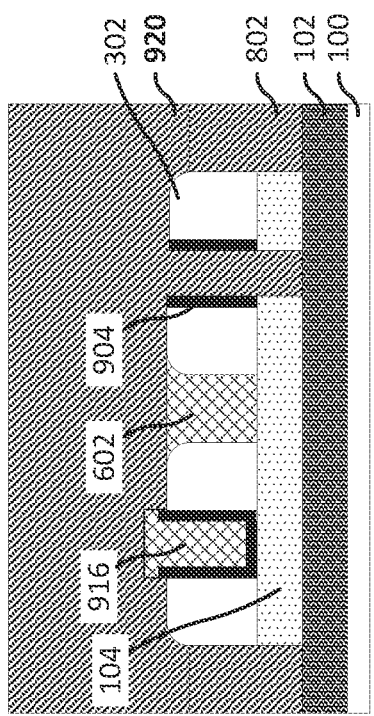
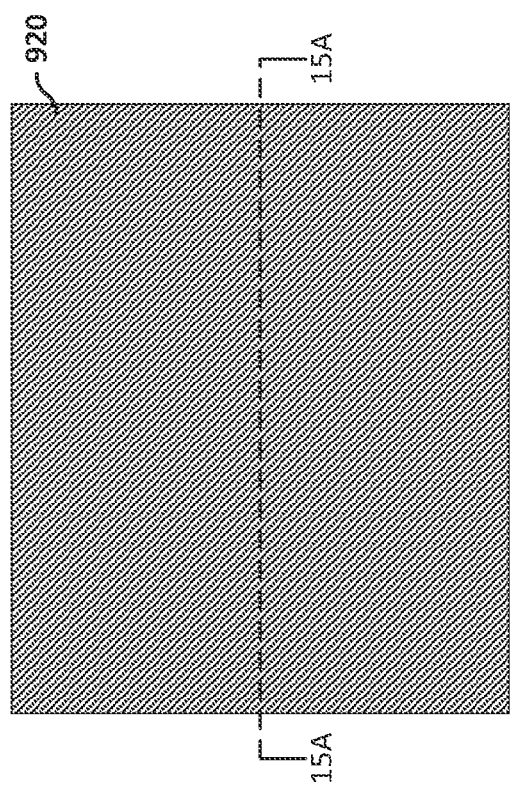
FIGURE 16A
FIGURE 16B

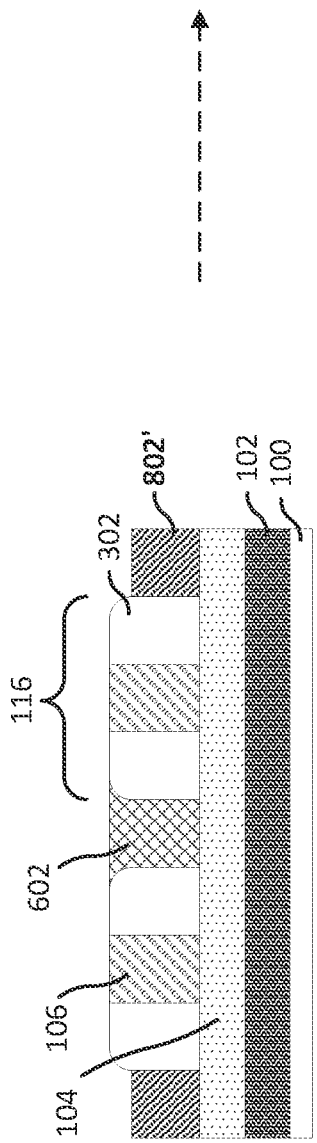
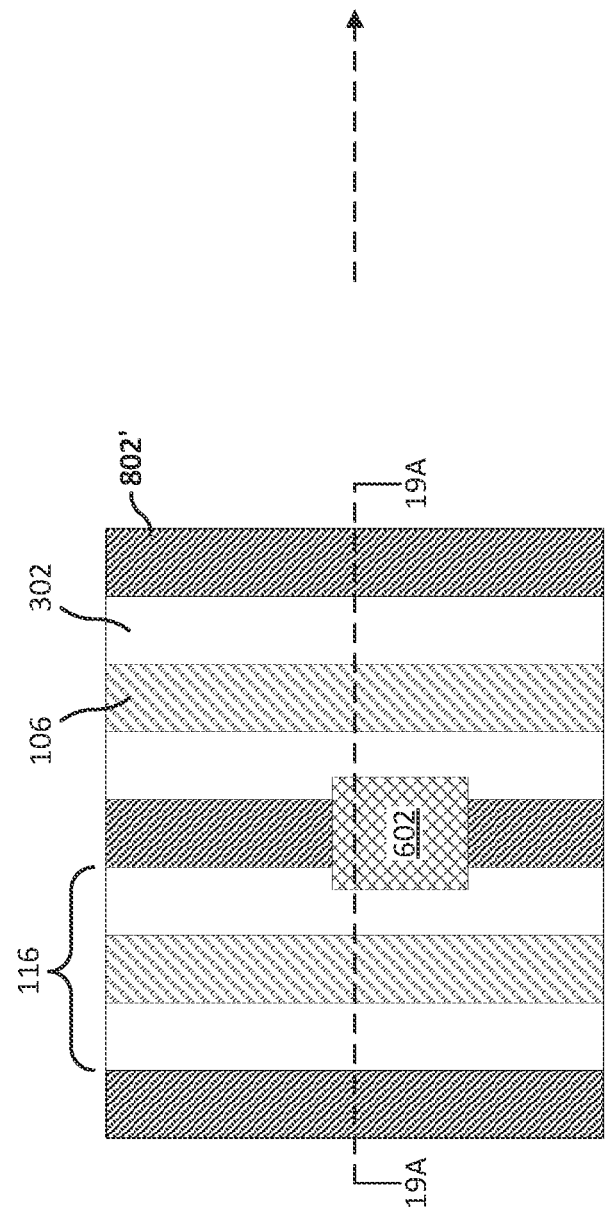
FIGURE 19A
FIGURE 19B

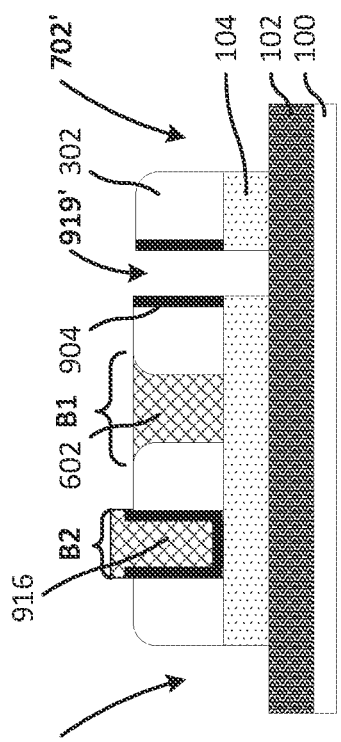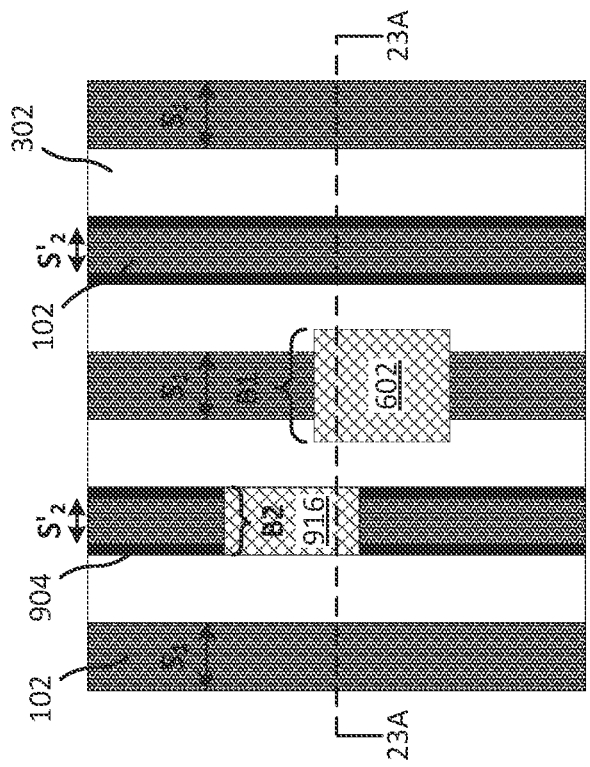
FIGURE 22A
FIGURE 22B
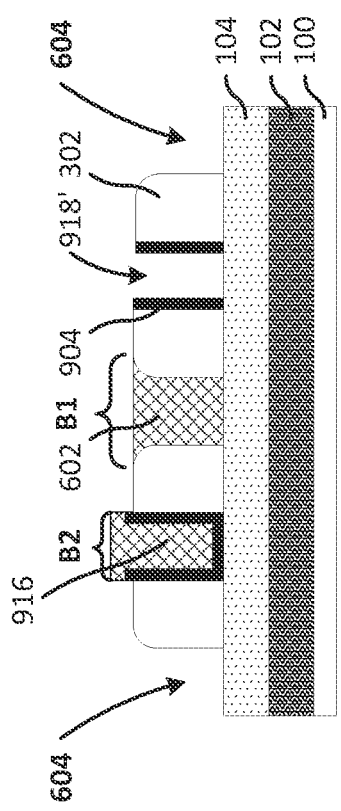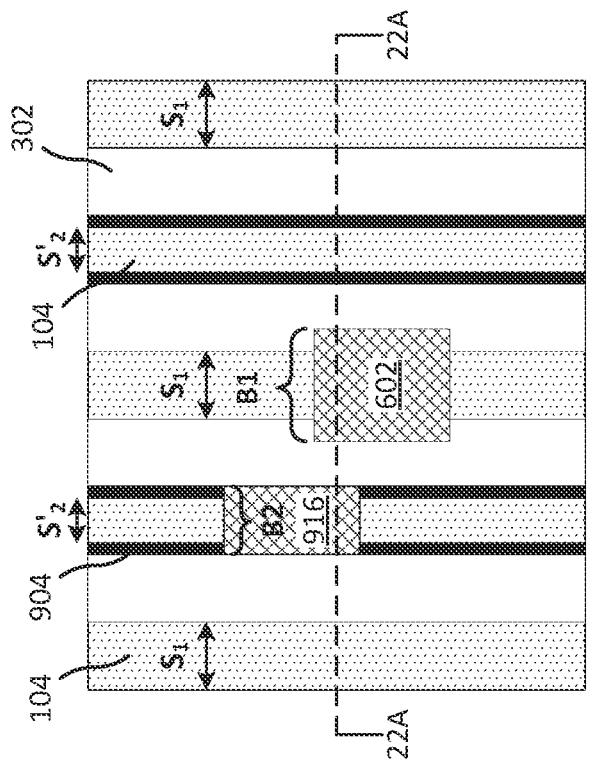
FIGURE 23A
FIGURE 23B

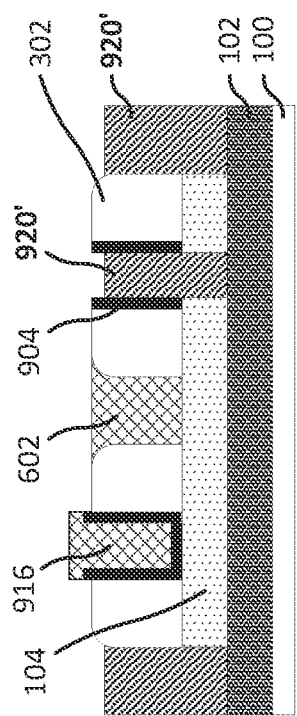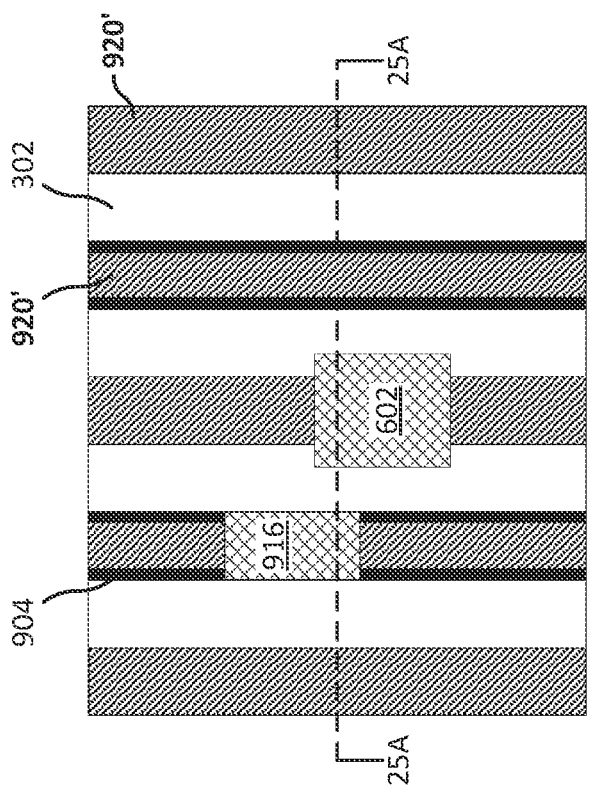
FIGURE 24A
FIGURE 24B
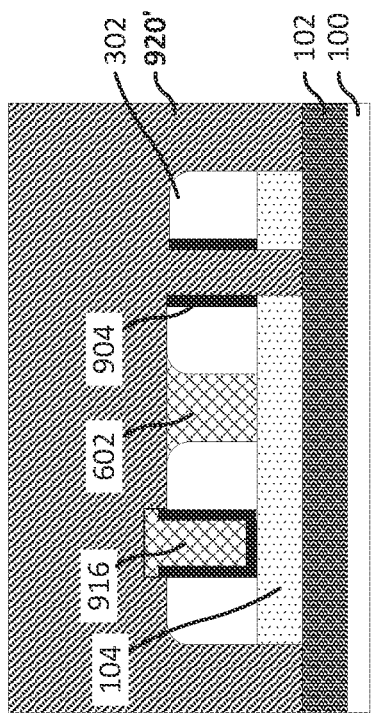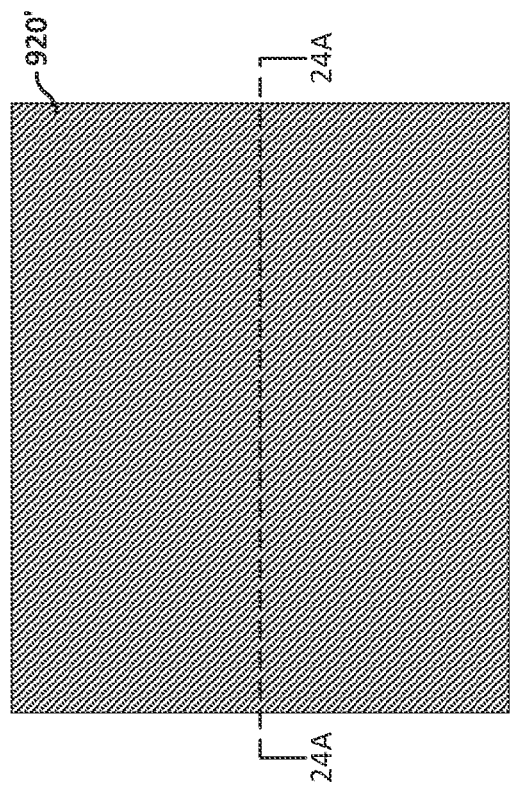
FIGURE 25A
FIGURE 25B

DOUBLE PATTERNING METHOD OF PATTERNING A SUBSTRATE

TECHNICAL FIELD

The present invention relates generally to a method of forming a semiconductor device, and, in particular embodiments, to a double patterning method for patterning a substrate.

BACKGROUND

An integrated circuit (IC) is a network of electronic circuit components in a monolithic structure fabricated by processing a semiconductor substrate through a sequence of patterning levels where, at each level, a layer is deposited and patterned using lithography processes to build the IC structure in a stack of patterned layers of various materials. The component packing density at each new technology node is doubled to reduce cost. Generally, this needs reducing feature size with higher resolution optics enabled by reducing a wavelength ($\lambda$) of the light source: from mercury vapor lamps at 436 nm, 405 nm, and 365 nm $\lambda$ to deep ultraviolet (DUV) excimer lasers (the 248 nm $\lambda$ KrF and the 193 nm $\lambda$ ArF laser). Introduced at the 90 nm node, 193 nm lithography remained the workhorse for the next six nodes, including the 10 nm node, where the half-pitch (HP) in critical patterns is below 25 nm. In theory, the HP is limited by the Rayleigh criterion, $HP=\lambda/(4\ NA)$, where NA is numerical aperture. Thus, a limit for HP, even with high-NA (NA=1.33) 193 nm $\lambda$ immersion (193i) optics, is 36 nm and, in practice, the minimum HP achieved by 193i optical systems is about 48 nm. Patterns with HP below the physical limit has been accomplished using multiple patterning, where each pattern is printed at the resolution limit of the optical system. Critical patterns for sub-10 nm nodes may shrink HP to 15 nm, ushering in 13.5 nm extreme ultraviolet lithography (EUVL), and further scaling may utilize a combination of EUVL and double patterning. It is, therefore, desirable to develop innovative methods addressing issues associated with double patterning.

SUMMARY

A method of forming a semiconductor device, where the method includes: forming, over a hardmask layer and an underlying layer of a substrate, a pattern of first trenches between adjacent template lines, each of the first trenches exposing a portion of the hardmask layer, and each of the template lines including a mandrel and spacers on sidewalls of the mandrel; forming a pattern of first blocks over the pattern of the first trenches and the template lines, the first blocks dividing the first trenches to form a pattern of first stencil trenches; transferring the pattern of first stencil trenches to the hardmask layer to form a pattern of first hardmask trenches, each of the first hardmask trenches exposing a portion of the underlying layer; forming a first fill layer filling the first hardmask trenches and exposing the mandrels; selectively removing the mandrels to form second trenches, each of the second trenches exposing a portion of the hardmask layer; and forming a conformal liner in the second trenches and over a surface of the spacers, a surface of the first blocks, and a surface of the first fill layer to form third trenches.

A method of forming a semiconductor device, where the method includes: forming a hardmask layer over an underlying layer of a substrate; using a lithography process, patterning a mandrel layer formed over the hardmask layer to form a pattern of mandrels; forming spacers on sidewalls of the mandrels and first trenches between spacers of adjacent mandrels; forming, over the first trenches, a pattern of first blocks exposing the mandrels and filling a portion of the first trenches, the unfilled portion defining a pattern of first stencil trenches; forming a first fill layer to fill the first stencil trenches and exposing the mandrels; selectively removing the mandrels to form second trenches; forming, over an exposed surface of the substrate, a conformal liner to form a pattern of third trenches, where the liner being formed in the second trenches forms the third trenches.

A method of forming a semiconductor device, where the method includes: providing a substrate having an underlying layer covered by a first layer and a second layer formed over the first layer; patterning the second layer to form a pattern of mandrels; forming spacers on sidewalls of the mandrels to form first trenches between spacers of adjacent mandrels, the mandrels being wider than the first trenches; measuring a first width of the mandrels and a second width of the first trenches; computing a first thickness from the measured first width and second width; filling the first trenches by forming first fill structures, the first fill structures covering an exposed region between adjacent spacers and exposing the mandrels; forming second trenches by selectively removing the mandrels; adjusting a process to conformally deposit a liner material having the first thickness; and using the adjusted process, forming a liner over an exposed surface of the substrate, where forming the liner in the second trenches forms third trenches.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-18B illustrate cross-sectional views and respective plan views of a semiconductor device at various intermediate stages of fabrication, in accordance with one embodiment;

FIGS. 19A-27B illustrate cross-sectional views and respective plan views of a semiconductor device at various intermediate stages of fabrication, in accordance with another embodiment;

DETAILED DESCRIPTION OF ILLUSTRATIVE EMBODIMENTS

Figure 4A:
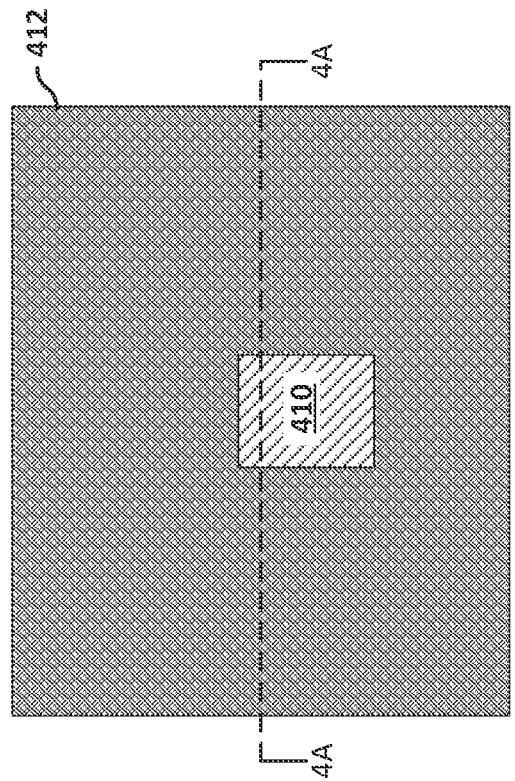

The present invention relates to patterning of layers of a substrate to fabricate a semiconductor device. The fabrication comprises a process flow, where a double patterning technique is used to form lines and spaces having a pitch that is half the minimum pitch capability of a lithography process used to print the pattern. The embodiments of methods, described in this disclosure, for fabricating semiconductor devices include process flows for double patterning that provide the advantages of reduced etch process complexity and reduced edge placement error (EPE), as explained in further detail below. One embodiment of a double patterning process flow, referred to as flow-A, is described with reference to FIGS. 1A-18B. Flow A may be used to pattern trenches in a hardmask layer, where the patterned hardmask layer comprises lines and spaces at about half the minimum pitch of the lithography process. An embodiment to form the same pattern with the same set of materials may use a modified process flow, referred to as flow B, described with reference to FIGS. 19A-27B. Both process flows (flow A and flow B) utilize a self-aligned double patterning (SADP) technique along with a double pattern of self-aligned blocks (SAB) formed using a litho-etch-litho-etch (LELE) approach. The two process flows are summarized in two flow charts illustrated in FIGS. 28 and 29. A feed-forward process control method to reduce pitch walking is described with reference to a flow chart illustrated in FIG. 30.

With multiple patterning techniques, a patterned layer may be formed to fabricate semiconductor devices, where the pattern density is greater than the maximum pattern density in any resist mask used in forming the patterned layer. In a commonly used SADP process flow, a layer of a material is formed over a substrate and patterned using a lithography process to form a periodic line and space (L/S) pattern of mandrels having a linewidth $W_M$. Since a patterned resist mask has been used to form the L/S pattern of mandrels, its pitch, $P_M$, is limited by a minimum pitch with which resist lines may be printed reliably. Self-aligned spacers having a spacer width, L, are then formed along sidewalls of each of the mandrels. The dimensions $W_M$ and L are selected such that an array of first trenches are formed between the spacers of adjacent mandrels. A surface of width, $S_1=P_M-(W_M+2L)$, of a vertically adjacent layer (e.g., a hardmask layer) is exposed at the bottom of each of the first trenches. Subsequently, an array of second trenches is formed by a mandrel-pull etch step that selectively removes the mandrels, where each of the second trenches expose a surface of width, $S_2=W_M$. With the mandrels removed, an L/S pattern of spacers is formed, where the number of spacers within the pitch $P_M$ is double the number of mandrels. In other words, the density of lines in the L/S pattern of spacers is double the maximum density with which resist lines can be patterned using the same lithography process. Thus, a pattern transfer etch with the spacers as an etch mask may be used to form an L/S pattern in the vertically adjacent layer below the spacers that has half the minimum pitch of the lithography process. It is noted that, while each of the lines have the same linewidth equal to L, the spaces alternate between a first space $S_1=P_M-(W_M+2L)$ and a second space $S_2=W_M$. Generally, $W_M$ and L are selected such that $S_1=S_2$, in order to achieve a uniform pitch, $P=\frac{1}{2} P_M$ for the L/S pattern of spacers.

There is, however, one caveat concerning the pitch, P, of the L/S pattern of spacers. The pitch, $P_M$, being determined by the reticle and the optics of the lithography system, has negligible variation from run to run. In contrast, the mandrel width ($W_M$) and the spacer width (L) have larger variability due to processing variations in the lithography, deposition, and etch process steps used in forming the mandrels and the spacers. Thus, even if $W_M$ and L are selected such that $S_1=S_2$, processing variations may result in an L/S pattern where the spaces alternate between two unequal values. Accordingly, the pitch for the array of spacer lines would alternate between a first pitch $P_1=(S_1+L)$ and a second pitch $P_2=(S_2+L)$, a phenomenon known as pitch walking. As known to persons familiar in the art, pitch walking is undesirable as it contributes to EPE in the pattern of spacers, which is then transferred to the layer below the spacers by the pattern transfer etch. The embodiments in this disclosure provide the advantage of reducing pitch walking by adjusting $S_2$ to reduce a difference between $S_1$ and $S_2$, as explained in further detail below.

FIGS. 1A and 1B illustrate a cross-sectional view and a respective planar view of a semiconductor substrate comprising a hardmask layer 104 over an underlying layer 102. The underlying layer 102 is the layer to be patterned using the hardmask layer 104 as an etch mask, after the hardmask layer 104 has been patterned using an SADP technique along with a double pattern of SAB, as described in further detail below. Other layers of the substrate below the underlying layer 102 are collectively shown as a substrate layer 100. A material layer for mandrels 106 has been deposited over the hardmask layer 104. A lithography stack 114 has been formed over the layer for mandrel 106, and a resist layer 112 has been patterned over the lithography stack 114 using a lithography process. In this example, the lithography stack 114 comprises an antireflective coating 110, adjacent below the resist layer 112, and a planarizing layer 108 below the antireflective coating 110, as illustrated in the cross-sectional view in FIG. 1A.

The antireflective coating may comprise a bottom antireflective coating (BARC), for example, an organic BARC, a silicon antireflective coating (SiARC), SiC, and the like. The planarizing layer 108 may comprise a spin on glass (SOG), an organic planarizing layer (OPL), a spin-on carbon (SOC), amorphous carbon, and the like.

In FIGS. 2A and 2B, the material layer for mandrels 106 has been patterned to form an L/S pattern of mandrels 106. This may be achieved with a multi-step etch process. For example, the patterned resist layer 112 may be used as an etch mask to pattern a portion of the lithography stack 114, which is then used as an etch mask to etch the remaining portion of the lithography stack 114. After the lithography stack 114 is patterned, it is used as an etch mask to form a pattern of mandrels 106.

It is noted that the mandrels 106 are narrower than the respective resist lines in the patterned resist layer 112. As explained above, the space between adjacent mandrels 106 has to accommodate two spacers and open the space $S_1$ between the two spacers to form the first trenches. Accordingly, in the L/S pattern of mandrels 106, the space between mandrels 106 ($S_1+2L$) is the major fraction of the pitch, $P_M$, that is, $W_M$ is smaller than $\frac{1}{2} P_M$. Since the resolution limit of the optics is roughly $\frac{1}{2} P_M$ ($P_M$ being close to the minimum pitch of the lithography process), $W_M$ is, typically, less than the minimum linewidth for a resist line that may be printed by the lithography system. Thus, the resist lines formed after exposing the resist to a radiation pattern and developing the exposed resist are wider than $W_M$, as shown in the patterned resist layer 112 in FIGS. 1A and 1B. A linewidth reduction etch may be performed to trim the resist lines to the sub-resolution linewidth $W_M$ prior to transferring the resist pattern to the lithography stack 114 to form the etch mask for etching the pattern of mandrels 106, illustrated in FIGS. 2A and 2B.

Figure 3A:
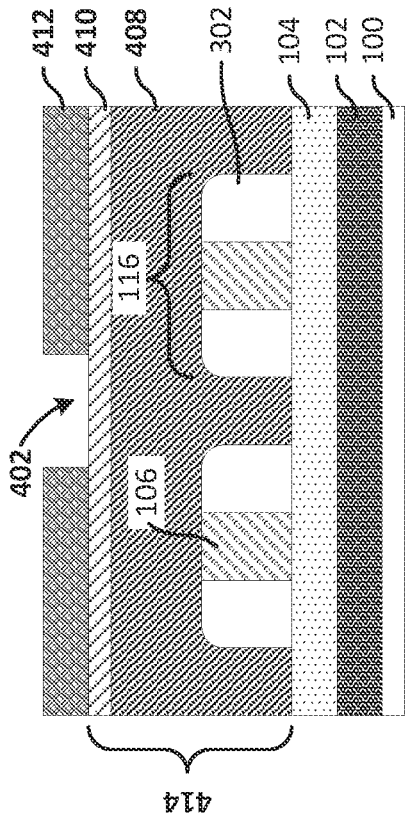
Figure 3B:
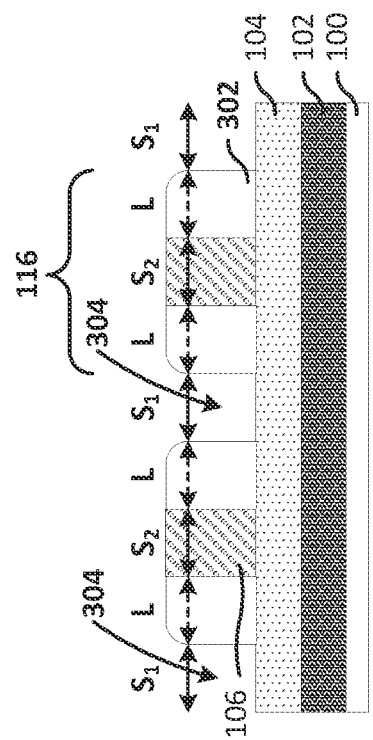

In FIGS. 3A and 3B, spacers 302, having a width, L, have been formed on sidewalls of each of the mandrels 106. Each region between two spacers 302, which are formed on two of the mandrels 106 that are adjacent to each other, is a first trench 304, exposing a surface of the hardmask layer 104 of width $S_1$ equal to the respective space between the spacers 302. The layer having the pattern of mandrels 106 is a sacrificial layer, where the L/S pattern of mandrels is used to form a derivative pattern of lines and spaces with a pitch equal to $P_M$. Each line of this derivative L/S pattern is each of the mandrels 106 along with the spacers 302 on its sidewalls. This structure is referred to as an SADP template line and the pattern of SADP template lines is referred to as the template lines 116 in this disclosure. As mentioned above, the mandrels 106 would be removed in a subsequent mandrel-pull etch step to form the second trenches exposing a surface of width, $S_2=W_M$.

The spacers 302 may be formed by a conventional self-aligned sidewall spacer technique, where spacer material is deposited roughly conformally over the substrate. The spacer material is selectively etched using an anisotropic etching technique (e.g., reactive ion etch (RIE)) that clears the tops of the mandrels 106 and removes spacer material from over the hardmask layer 104 between the mandrels 106 to form the spacers 302 and the first trenches 304. Forming the spacers 302 forms the pattern of template lines 116. A width of each of the template lines is $L_1=(2L+S_2)$ and the space between two template lines 116, adjacent to each other, is $S_1=P_M-L_1$, the pitch being defined as a sum of each line ($L_1$) and each space ($S_1$), as illustrated in FIGS. 3A and 3B.

After forming the pattern of first trenches 304 between template lines 116 that are adjacent to each other, the process flow proceeds to perform a sequence of process steps to form a pattern of first blocks 602 over the pattern of the first trenches 304 and the template lines 116. An example of the process steps to form the pattern of first blocks 602 is described below with reference to FIGS. 4A-6B.

Figure 4B:
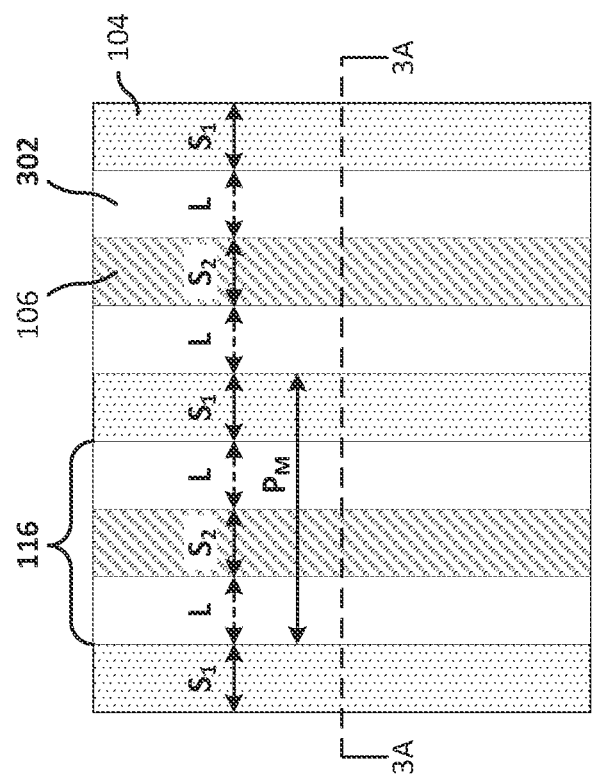

In FIGS. 4A and 4B, a lithography stack 414 has been formed over the pattern of first trenches 304 and template lines 116. Similar to the lithography stack 114 (see FIG. 1A), the lithography stack 414 comprises a planarizing layer 408 and an antireflective coating 410. A patterned resist layer 412 comprising a pattern of openings 402 has been formed over the lithography stack 414 using a lithography process similar to that used to form the patterned resist layer 112. The pattern of openings 402 in the resist layer 412 is designed such that each of the openings 402 is positioned directly over a region that includes a location of a respective first block to be formed, where the first block would be filling a portion of a first trench 304.

Figure 5A:
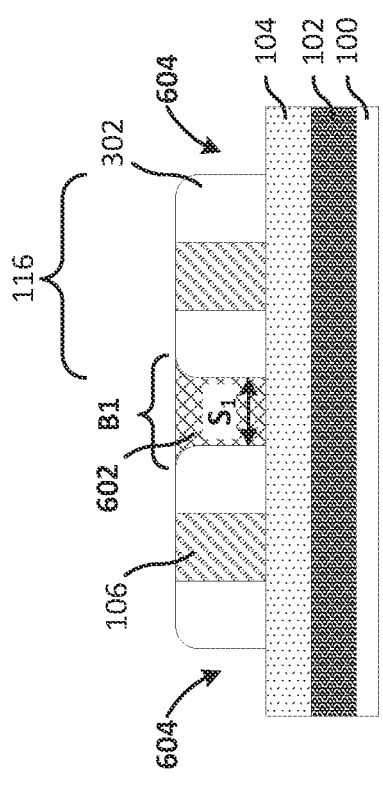
Figure 5B:
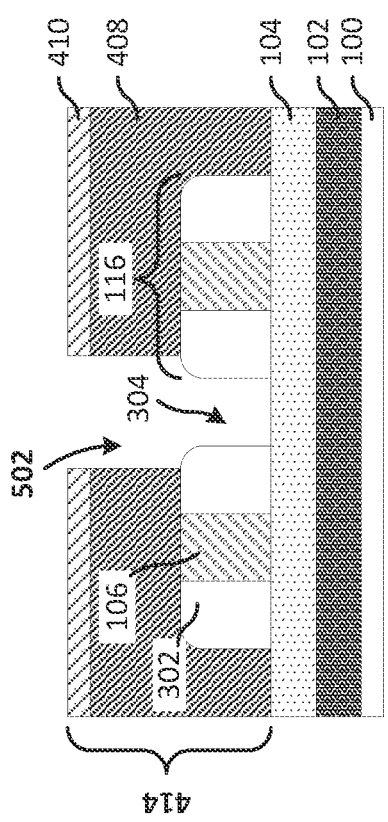

The patterned resist layer 412 comprising the pattern of openings 402 is used as an etch mask to etch the lithography stack 414 (i.e., the antireflective coating 410 and the planarizing layer 408) using an etch chemistry that removes material selective to the spacers 302 and the hardmask layer 104. In various embodiments, the etch selectivity may be greater than 10 and less than 100. Accordingly, as illustrated in FIGS. 5A and 5B, the etching stops on the spacers 302, while material continues to be removed from the region between the spacers 302 till the hardmask layer 104 at the bottom of the now opened portion of the first trench 304 is exposed. When the etching is completed, a pattern of first holes 502 has been formed through the lithography stack 414. In each of the first holes 502, there is a respective exposed portion of the hardmask layer 104, as seen from the cross-sectional view and planar view of the semiconductor device illustrated in FIGS. 5A and 5B. In FIGS. 5A and 5B, the antireflective coating 410 is present. In some other embodiment, the antireflective coating 410 may be removed while the lithography stack 414 is being etched.

As explained in further detail below, each exposed portion of the hardmask layer 104 in the first hole 502 defines a location from where removal of material to pattern trenches in the hardmask layer 104 would be blocked during a subsequent etch step. Blocking the removal of the hardmask layer 104 at that location divides an otherwise long hardmask trench into shorter segments in the pattern of trenches in the hardmask layer 104. This pattern of trenches in the hardmask layer 104 is also formed in the underlying layer 102, which is the layer to be patterned using the hardmask layer 104 as an etch mask.

After forming the pattern of first holes 502, the pattern of first blocks 602 is formed, where each of the first blocks 602 is disposed inside the first holes 502. This may be achieved by overfilling the opened portions of the first trenches 304 (in some embodiments, even overfilling the first holes 502) and performing a recess etch to remove excess material from the surface over the lithography stack 414 and a top portion of the first holes 502 to place a surface of the first blocks 602 inside the first holes 502. After forming the pattern of first blocks 602, the lithography stack 414 is removed.

Figure 6A:
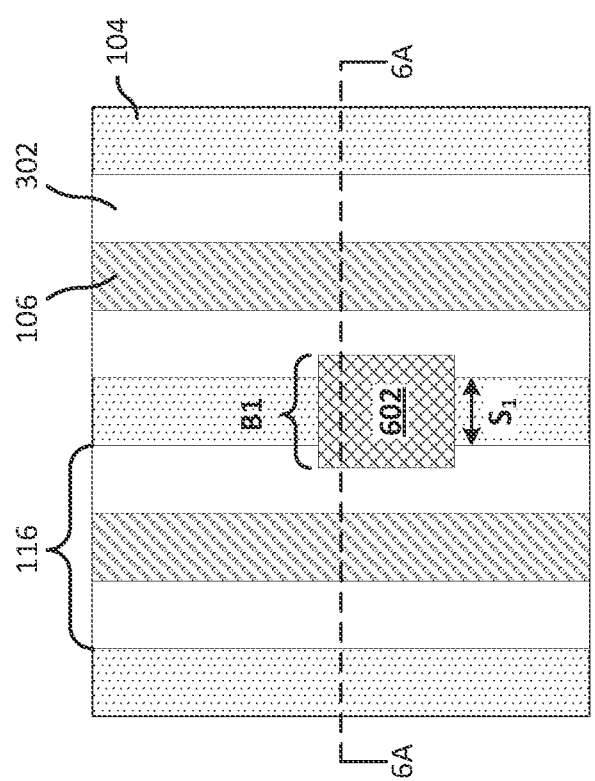
Figure 6B:
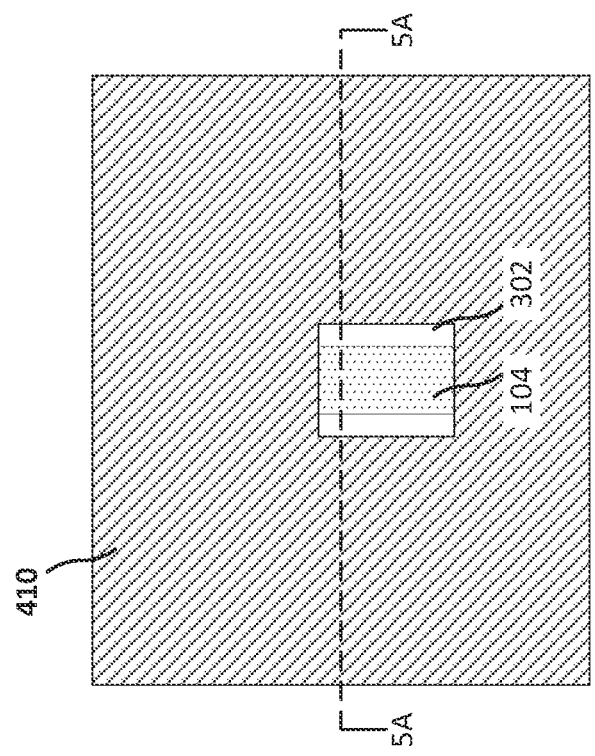

FIG. 6A illustrates a cross-sectional view of the semiconductor device after removing the lithography stack 414, and FIG. 6B illustrates the respective planar view. The first block 602, indicated by B1 in FIGS. 6A and 6B, is filling the portion of the first trench 304 that was opened by forming the first hole 502 (see FIGS. 5A and 5B). Filling the opened portion of the first trench 304 divides the first trench 304 into shorter segments, forming a derivative pattern of trenches, referred to here as first stencil trenches 604.

In this disclosure, the term stencil trenches refers to trenches through which etchants are introduced that etch the hardmask layer 104 to form trenches, referred to as hardmask trenches, in the hardmask layer 104.

With the lithography stack 414 removed, a major surface of the substrate includes a surface of the hardmask layer at the bottom of the first stencil trenches 604, a surface of the template lines 116, and the surface of the first blocks 602, as illustrated in FIGS. 6A and 6B. The recess etch may be timed to position the surface of the first block 602 coplanar with the tops of the mandrels 106, as seen in the example in FIG. 6A. However, the height of the first blocks 602 is not critical and, in various embodiments the surface of the first blocks 602 may be slightly above or below the surface of the mandrels 106.

As explained above, the purpose of the pattern of first blocks 602 is intended to block etchants in a subsequent etch step, where the etchants remove the hardmask layer 104 through the bottom of the first stencil trenches 604. The portion of the hardmask layer 104 covered by the first blocks 602 would remain intact during that subsequent etch step. This breaks the continuity for a long trench in the hardmask layer 104, thus forming shorter segments instead of one long trench.

The width of the exposed portion of the hardmask layer 104 (exposed by the first holes 502) is $S_1$. Thus, to ensure that each of the first blocks 602 covers the entire width $S_1$, a width of each of the openings 402 is designed to be larger than $S_1$, as illustrated in FIGS. 4A and 4B. Accordingly, a width of the first holes 502 is also patterned larger than $S_1$, as illustrated in FIGS. 5A and 5B. The width of the openings 402 is selected to be sufficiently large to allow margin for EPE in patterning the lithography stack 414, where the EPE is in a direction perpendicular to the template lines 116. Thus, despite EPE, the edges in the lithography stack 414, which are parallel to the template lines 116, get placed outside the bottom of the opened portion of the first trench 304, as seen in FIGS. 5A and 5B. This ensures that the pattern of first stencil trenches 604 in FIGS. 6A and 6B is immune to EPE in the patterned resist layer 412, in the perpendicular direction (perpendicular to the template lines 116). However, the EPE has to be controlled to prevent the first block 602 from covering any adjacent mandrel of the mandrels 106 because, in a subsequent step, the surface of the mandrels 106 has to be exposed to etchants used to remove the mandrels 106.

Both process flows, flow A and flow B, use identical processing to form the structure of the semiconductor device illustrated in FIGS. 6A and 6B, the structure comprising the template lines 116, the first stencil trenches 604, and the first blocks 602, formed over the hardmask layer 104. The hardmask layer 104 is formed over the underlying layer 102, which is in a semiconductor substrate having various other layers, collectively referred to as substrate layer 100.

In flow A, after forming the pattern of first stencil trenches 604, the pattern is transferred to the hardmask layer 104 by selectively etching the hardmask layer 104 to form a pattern of first hardmask trenches 702, as illustrated in FIGS. 7A and 7B. Each of the first hardmask trenches 702 expose a portion of the underlying layer 102. The etch chemistry removes the exposed portion of the hardmask layer 104 selective to the underlying layer 102, the mandrels 106, the spacers 302, and the first blocks 602.

In FIGS. 8A and 8B, a first fill layer 802 is formed filling the first hardmask trenches 702 to cover the portion of the underlying layer 102 which was exposed by forming the pattern of first hardmask trenches 702 (see FIGS. 7A and 7B). The first fill layer 802 may be formed by overfilling the first hardmask trenches 702 with a first fill material and performing a recess etch to remove excess first fill material from over the surfaces of the template lines 116 and the first blocks 602. The recess etch may be adjusted to expose the mandrels 106 and place a surface of the first fill layer 802 above the hardmask layer 104.

After forming the first fill layer 802, the exposed mandrels 106 are removed during a mandrel-pull step using an etch process that selectively removes the mandrels 106. In FIGS. 9A and 9B, the mandrel-pull etch process is complete. Removing the mandrels 106 selectively forms a pattern of second trenches 902, where each of the second trenches 902 have sides defined by the spacers 302 that were formed along opposite sidewalls of the respective mandrel of the mandrels 106 using a self-aligned sidewall spacer technique, described above with reference to FIGS. 3A and 3B. An exposed portion of the hardmask layer 104 is seen at the bottom of each of the second trenches 902, as illustrated in a cross-sectional view and a planar view in FIGS. 9A and 9B. The cavities of the second trenches being the region vacated by the mandrels 106, a width, $S_2$, of the exposed portion of the hardmask layer 104 at the bottom of each of the second trenches 902 is same as the width, $W_M$, of the mandrel 106 that has been occupying the same space, i.e., $S_2=W$.

In FIGS. 10A and 10B, a conformal liner 904 has been deposited over the substrate. Forming the conformal liner 904 along the sides and bottoms of the second trenches 902 (see FIG. 9A) forms a pattern of third trenches 906. It is noted that a width, $S'_2$, of each of the third trenches 906 is reduced from the width, $S_2$, of the second trench 902, i.e., $S_2 < S'_2$. In particular, if the thickness of the conformal liner 904 is $T_L$ then $S'_2 = (S_2 - 2T_L)$. This provides an opportunity to adjust a respective dimension in a pattern trenches subsequently patterned in the hardmask layer 104 and then transferred to the underlying layer 102, as explained in further detail below.

With feature sizes in advanced ICs being reduced to nanoscale dimensions, the liner thickness, $T_L$, may be very small. In one embodiment, $T_L$ may be less than 1.5 nm and greater than or equal to 1 nm and, in various embodiments, less than 5 nm and greater than or equal to 0.5 nm As known to persons skilled in the art, atomic layer deposition (ALD) systems are capable of forming extremely thin films with high precision and accuracy. Accordingly, the conformal liner 904 may be formed using a suitable ALD process.

Materials of which various layers are formed are selected such that appropriate etch chemistries may be chosen to perform selective etching with sufficient etch selectivity (e.g., an etch selectivity greater than 10). In one embodiment, the underlying layer 102, the hardmask layer 104, the mandrels 106, the spacers 302, the first blocks 602, the first fill layer 802, and the conformal liner 904 comprise silicon, silicon oxide, amorphous silicon, silicon nitride, metal oxide, metal nitride, and metal respectively. In some embodiments, the spacers 302, the first blocks 602, and the conformal liner 904 may comprise the same material. However, the underlying layer 102, the hardmask layer 104, and the first fill layer 802 should be of different materials, and the hardmask layer 104 should be of a material different from that used for the spacers 302, the first blocks 602, and the conformal liner 904.

After forming the pattern of third trenches 906 by depositing the conformal liner 904 in the spaces vacated by removing the mandrels 106 and defined by the spacers 302 on opposite sides of each mandrel, the process flow proceeds to perform a sequence of process steps to form a pattern of second blocks 916 over the conformal liner 904. The processing to form the second blocks 916 may mimic the processing used to form the pattern of first blocks 602. An example of the process steps to form the pattern of second blocks 916, is described below with reference to FIGS. 11A-13B.

Figure 11B:
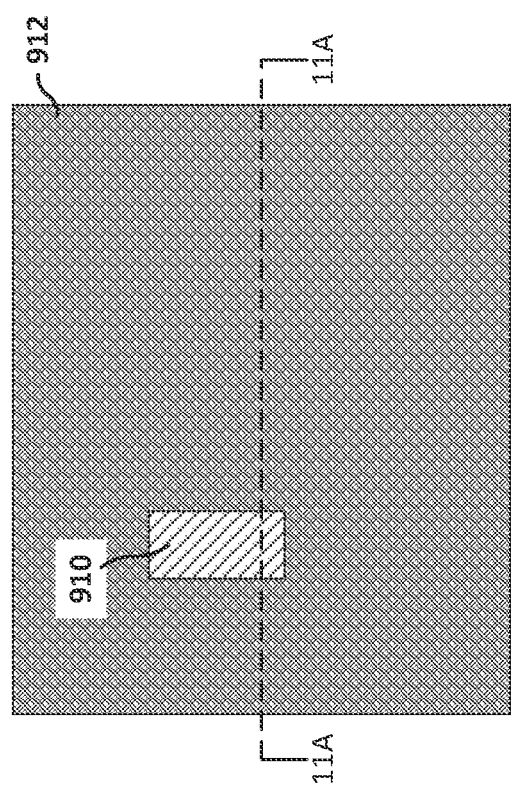
Figure 11A:
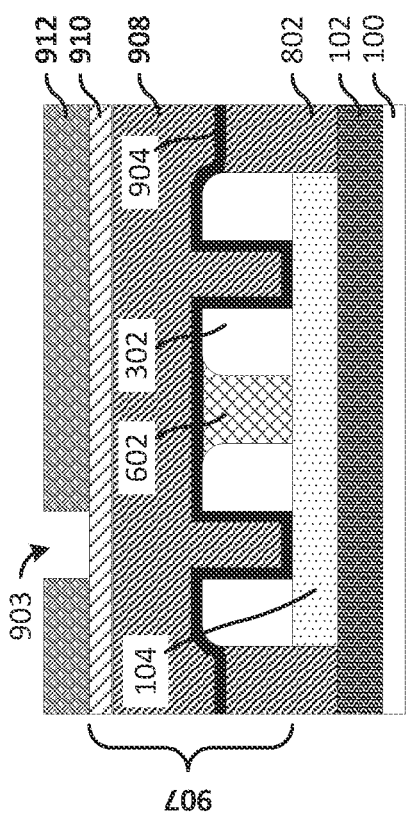

In FIGS. 11A and 11B, a lithography stack 907 has been formed over the conformal liner 904. Similar to the lithography stack 114 (see FIG. 1A), the lithography stack 907 comprises a planarizing layer 908 and an antireflective coating 910. A patterned resist layer 912 comprising a pattern of openings 903 has been formed over the lithography stack 907 using a lithography process similar to that used to form the patterned resist layer 112. The pattern of openings 903 in the resist layer 912 is designed such that each of the openings 903 is positioned directly over a region that includes a location of a respective second block to be formed filling a portion of a third trench 906.

Figure 12B:
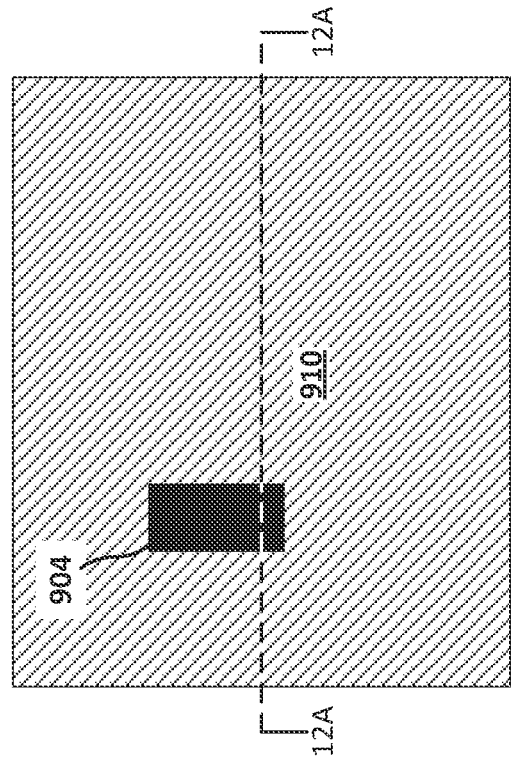
Figure 12A:
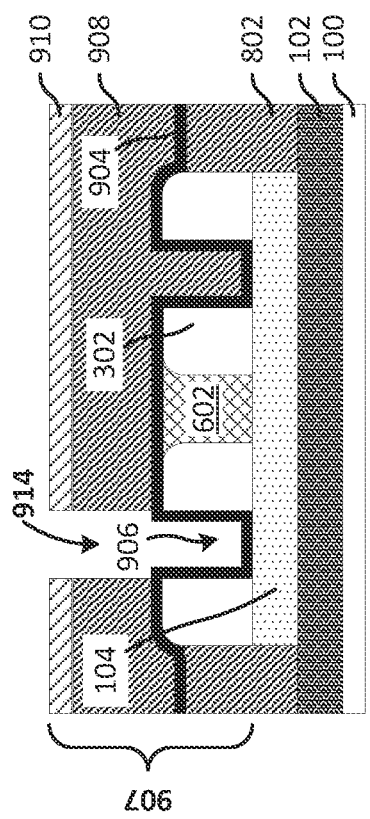

The patterned resist layer 912 comprising the pattern of openings 903 is used as an etch mask to etch the lithography stack 907 using an etch chemistry that removes material selective to the spacers 302 and the conformal liner 904. In various embodiments, the etch selectivity may be greater than 10 and less than 100. Accordingly, as illustrated in FIGS. 12A and 12B, the etch stops on the spacers 302, while material continues to be removed from the region between the spacers 302 till the conformal liner 904 at the bottom of the now opened portion of the third trench 906 is exposed. When the etching is completed, a pattern of second holes 914 has been formed through the lithography stack 907. In each of the second holes 914, there is a respective exposed portion of the conformal liner 904, as seen from the cross-sectional view and planar view of the semiconductor device illustrated in FIGS. 12A and 12B. In FIGS. 12A and 12B, the antireflective coating 910 is present. In some other embodiment, the antireflective coating 910 may be removed while the lithography stack 907 is being etched.

After forming the pattern of second holes 914, the pattern of second blocks 916 is formed, where each of the second blocks 916 is disposed inside the second holes 914. This may be achieved by overfilling the opened portions of the third trenches 906 (in some embodiments, even overfilling the second holes 914) and performing a recess etch to remove excess material from the surface over the lithography stack 907 and a top portion of the second holes 914 to place a surface of the second blocks 916 inside the second holes 914. The first blocks 602 and the second blocks 916 may comprise the same material. After forming the pattern of second blocks 916, the lithography stack 907 is removed.

FIG. 13A illustrates a cross-sectional view of the semiconductor device after removing the lithography stack 907, and FIG. 13B illustrates the respective planar view. The second block 916, indicated by B2 in FIGS. 13A and 13B, is filling a portion of the third trench 906 that was opened by forming the second hole 914 (see FIGS. 12A and 12B), wherein the unfilled portions are referred to here as second stencil trenches 918. Filling the opened portion of the third trench 906 divides the third trench 906 into shorter segments, forming a derivative pattern of trenches, which is the pattern of second stencil trenches 918.

With the lithography stack 414 removed, the conformal liner 904 is exposed. As illustrated in FIGS. 13A and 13B, the conformal liner 904 covers the major surface of the substrate except for the regions covered by the pattern of second blocks 916. The recess etch may be timed to position the surface of the second block 916 coplanar with the conformal liner 904. In various embodiments the surface of the second blocks 916 may be slightly above or below a surface of the conformal liner 904.

Similar to the first blocks 602, the pattern of second blocks 916 is intended to block etchants in a subsequent etch step, where the etchants remove the hardmask layer 104 through the bottom of the second stencil trenches 918. The portion of the hardmask layer 104 covered by the second blocks 916 would remain intact during that subsequent etch step, thereby breaking the continuity of a long trench in the hardmask layer 104 to form shorter segments instead.

As explained above in reference to the pattern of first blocks 602, a width of the openings 903 is designed to be larger than the width, $S'_2$, hence also wider than the second holes 914 as illustrated in FIGS. 11A and 12A, respectively. Thus, despite EPE, the edges in the lithography stack 907, parallel to the spacers 302, get placed outside the bottom of the opened portion of the third trench 906, as seen in FIG. 12A. This ensures that the pattern of second stencil trenches 918 in FIG. 13A is immune to EPE in the patterned resist layer 912, in the perpendicular direction (perpendicular to the spacers 302). However, the EPE has to be controlled to prevent the second block 916 from covering any other second stencil trench 918.

After forming the pattern of second stencil trenches 918, the pattern is transferred to the hardmask layer 104 by selectively etching the hardmask layer 104 to form a pattern of second hardmask trenches 919, as illustrated in FIGS. 14A and 14B. Each of the second hardmask trenches 919 expose a portion of the underlying layer 102. The etch process for this pattern transfer etch may be a two-step etching technique, where, in the first step, the conformal liner 904 is removed from over the surface of the spacers 302, the surface of the first blocks 602, the surface of the first fill layer 802, and a bottomwall of the second stencil trenches 918. It is noted that the conformal liner 904 is removed anisotropically, such that it remains along the inner sides of the spacers 302. This ensures that the width of the openings of each of the second hardmask trenches 919 is also equal to $S'_2$.

A second fill layer 920 filling the second hardmask trenches 919 and exposing the surface of the spacers 302, the surface of the first blocks 602, the surface of the conformal liner 904, and the surface of the second blocks 916 is formed to cover the portion of the underlying layer 102 exposed by forming the second hardmask trenches 919. The process steps performed to form the second fill layer 920 are illustrated with reference to FIGS. 15A-16B.

In FIGS. 15A and 15B, the second hardmask trenches 919 have been overfilled with the second fill layer 920 comprising a second fill material. In some embodiments, the second fill layer 802 and the second fill layer 920 may comprise the same material. Generally, the fill layers comprise a flowable material such as spin-on carbon (SOC), spin on glass (SOG), organic planarizing layer (OPL), spin-on metal oxide, and spin-on SiC. In the example illustrated in FIGS. 15A and 15B, the substrate has been covered by the second fill layer 920.

In FIGS. 16A and 16B, a recess etch has been performed to remove excess fill material from over the surfaces of the spacers 302, the first blocks 602, the conformal liner 904, and the second blocks 916. In the example illustrated in FIGS. 16A and 16B, the surface of the second fill layer 920 is placed above the surface of the first fill layer 802. In some embodiments, the surface of the second fill layer 920 filling the second hardmask trenches 919 may be lower. In such embodiments, the portion of the second fill layer 920 formed above the first fill layer 802 would not be present, and the recess etch may have further recessed the first fill layer 802. In all embodiments, the surfaces of the first fill layer 802 and the second fill layer 920 are placed above the hardmask layer 104.

Figure 17A:
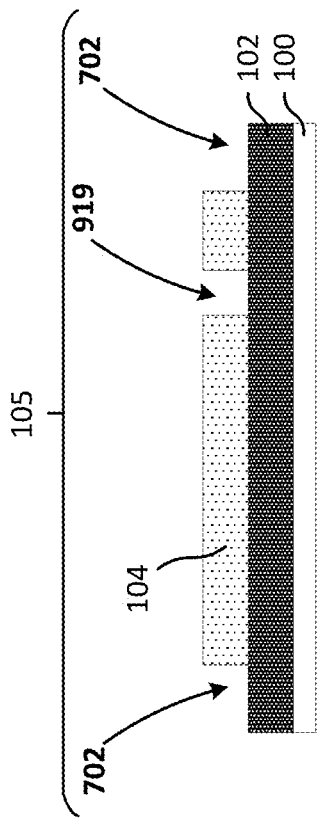
Figure 17B:
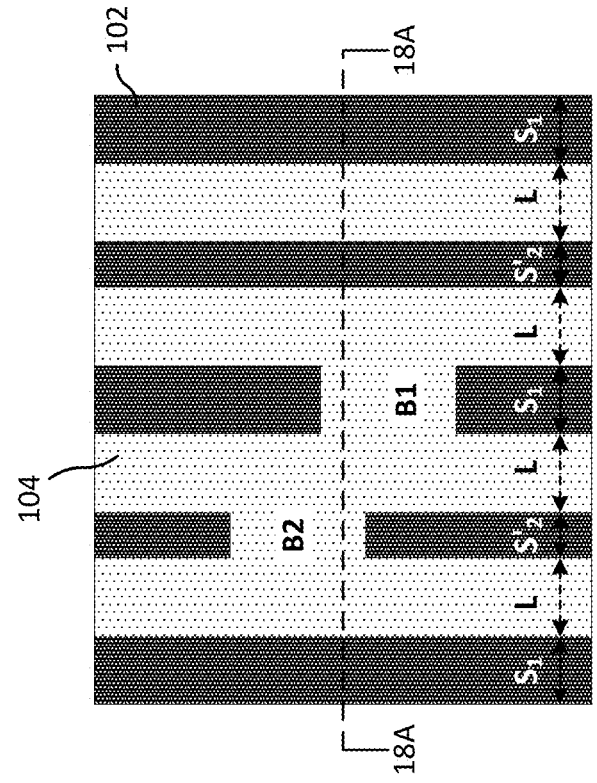

After the recess etch used in forming the second fill layer 920 is complete, the spacers 302, the first blocks 602, the conformal liner 904, and the second blocks 916 are removed selectively to expose the hardmask layer 104, as illustrated in FIGS. 17A and 17B. The hardmask layer 104 in FIGS. 17A and 17B is a patterned layer having a pattern of trenches comprising the pattern of first hardmask trenches 702 and the pattern of second hardmask trenches 919 covered by the first fill layer 802 and/or the second fill layer 920. It is noted that the underlying layer 102 is not exposed to the etchants during the removal of the spacers 302, the first blocks 602, the conformal liner 904, and the second blocks 916. Hence, the etchants need not have high selectivity to the materials in the underlying layer 102.

Figure 18A:
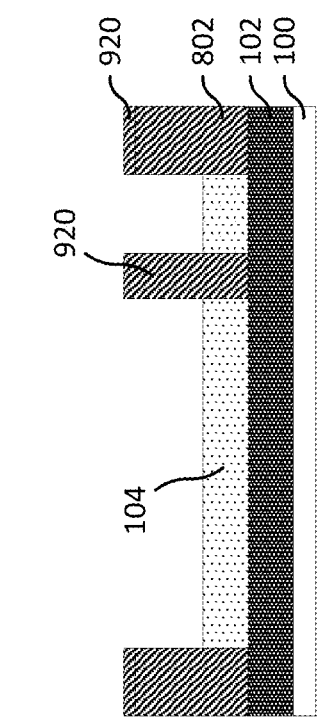
Figure 18B:
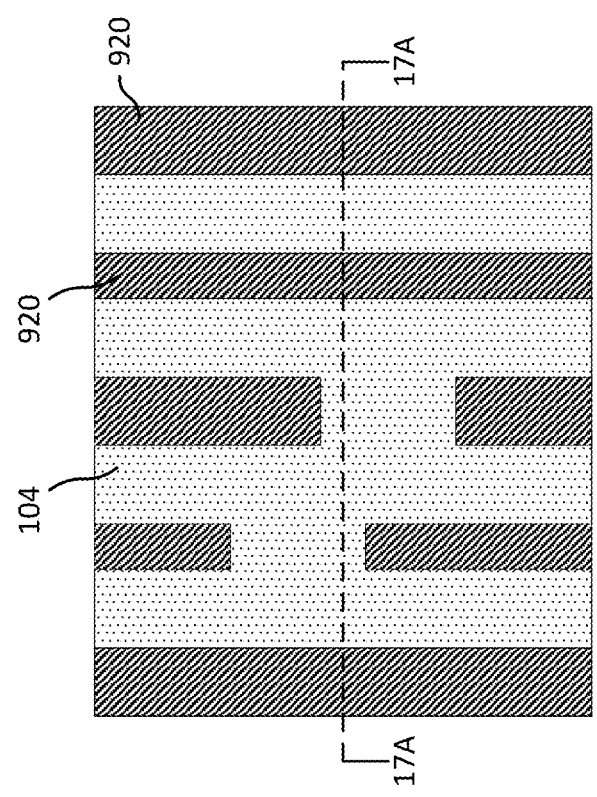

In FIGS. 18A and 18B, the first fill layer 802 and the second fill layer 920 have been removed, exposing a relief pattern 105 comprising first hardmask trenches 702 and second hardmask trenches 919 patterned in the hardmask layer 104. The hardmask layer 104, illustrated in FIGS. 18A and 18B may be used as an etch mask to transfer the relief pattern 105 to form a respective pattern of trenches in the underlying layer 102.

As mentioned above, an alternative embodiment to form the same pattern with the same set of materials may be achieved using a modified process flow, referred to as flow B. This embodiment is described below with reference to FIGS. 19A-27B.

Both process flows, flow A and flow B, use identical processing to form the structure of the semiconductor device illustrated in FIGS. 6A and 6B, the structure comprising the template lines 116, the first stencil trenches 604, and the first blocks 602, formed over the hardmask layer 104. However, in flow B, the first stencil trenches 604 is filled with a first fill layer 802' instead of first transferring the pattern of the first stencil trenches 604 to the hardmask layer 104 to form the first hardmask trenches 702 as was done in flow A (see FIGS. 7A and 7B) but is skipped at this stage in flow B.

FIGS. 19A and 19B illustrate the first fill layer 802' covering the first stencil trenches 604. The first fill layer 802' is formed with the mandrels 106 exposed, same as after the first fill layer 802 was formed in flow A (see FIGS. 8A and 8B).

Figure 20A:
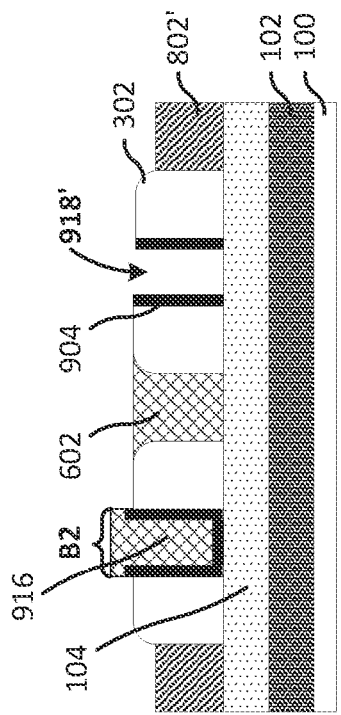
Figure 20B:
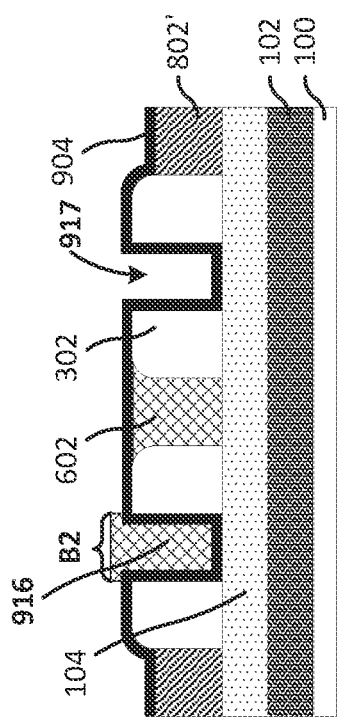

After forming the first fill layer 802', the processing in flow B repeats the processing in flow B (indicated by the dotted arrows in FIGS. 19A and 19B) to form a structure of the semiconductor device, illustrated in FIGS. 20A and 20B, which is similar to the structure of the semiconductor device illustrated in FIGS. 13A and 13B. The two structures are the same, except the first fill layer 802 of flow A (in FIGS. 13A and 13B) is covering the portion of the underlying layer 102 that was exposed at the bottom of the first hardmask trenches 702 (see FIGS. 7A and 7B), whereas the first fill layer 802' of flow B (in FIGS. 20A and 20B) is covering the portion of the hardmask layer 104 that was exposed at the bottom of the first stencil trenches 604 (see FIGS. 6A and 6B).

The processing indicated by the dotted arrows in FIGS. 19A and 19B include selectively removing the mandrels 106 to form second trenches 902 (see FIGS. 9A and 9B), forming the conformal liner 904 to form third trenches 906 (see FIGS. 10A and 10B), and forming the pattern of second blocks 916 (see FIGS. 11A-13B), resulting in the structure of the semiconductor device illustrated in FIGS. 20A and 20B.

Figure 21A:
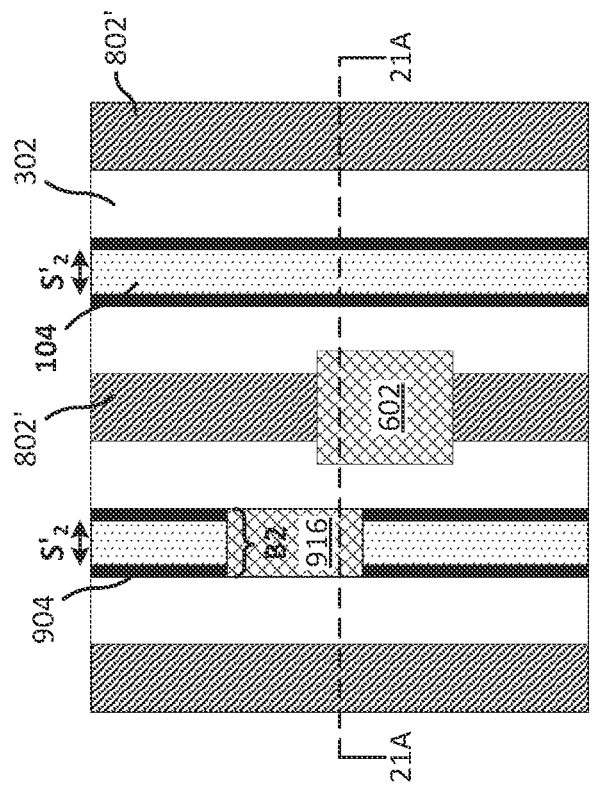
Figure 21B:
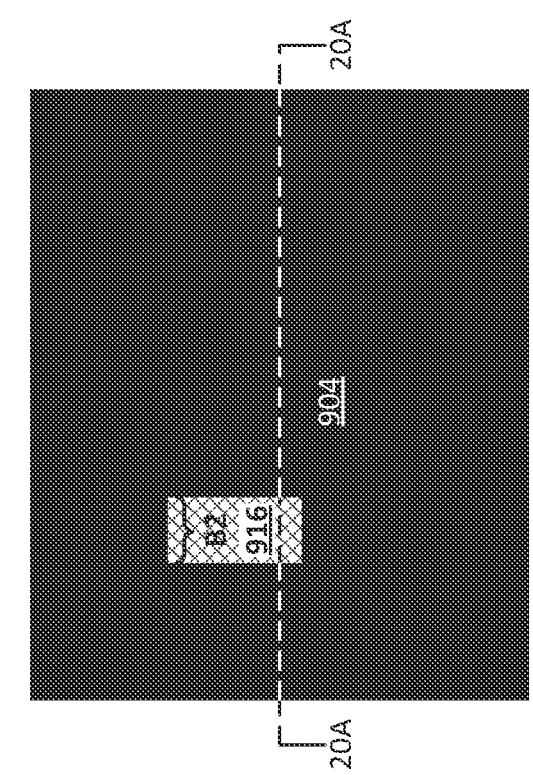

The pattern of second stencil trenches 918 of flow A, seen in FIG. 13A, is same as a pattern of fourth trenches 917, seen in FIG. 20A. A different name and numeral has been assigned because the fourth trenches 917 are modified in flow B to form a modified pattern of second stencil trenches 918'. As illustrated in FIGS. 21A and 21B, the modified pattern of second stencil trenches 918' is formed by performing an anisotropic etch process to remove the conformal liner 904 from bottoms of the fourth trenches, while the sides remain covered by the conformal liner 904.

After forming the modified pattern of second stencil trenches 918', the first fill layer 802' (in flow B) is removed to expose the bottoms of the first stencil trenches 604, as illustrated in FIGS. 22A and 22B. The first stencil trenches 604 have been formed during the common processing used in flow A and flow B, described above with reference to FIGS. 1A-6B. As seen in the cross-sectional view and the planar view of the semiconductor device illustrated in FIGS. 22A and 22B, the bottoms of the first stencil trenches 604, as well as the bottoms of the second stencil trenches 918' are exposing a portion of the hardmask layer 104.

Referring now to FIGS. 23A and 23B, an etch process that may selectively etch the hardmask layer 104 has been performed to form hardmask trenches by simultaneously transferring the pattern of first stencil trenches 604 and the pattern of second stencil trenches 918' to the hardmask layer 104. Each of the hardmask trenches expose a portion of the underlying layer 102. The group of hardmask trenches formed by etching through the bottoms of the first stencil trenches 604 are first hardmask trenches 702' and the hardmask trenches formed by etching through the bottoms of the second stencil trenches 918' are second hardmask trenches 919'. The locations of the first group of hardmask trenches comprising first hardmask trenches 702' (formed in flow B) is same as that of the first hardmask trenches 702 (formed in flow A). Likewise, locations of the second group of hardmask trenches comprising second hardmask trenches 919' (formed in flow B) is same as that of the second hardmask trenches 919 (formed in flow A).

A second fill layer 920' is formed using process steps similar to those used to form the second fill layer 920 in flow A, described above with reference to FIGS. 15A-16B. FIGS. 24A and 24B illustrate the hardmask trenches (the first hardmask trenches 702' and the second hardmask trenches 919') overfilled with a fill layer 920', and FIGS. 25A and 25B illustrate the structure after a recess etch has been performed such that the second fill layer 920' is filling the hardmask trenches (the first hardmask trenches 702' and the second hardmask trenches 919') and exposing the surface of the spacers 302, the surface of the first blocks 602, the surface of the conformal liner 904, and the surface of the second blocks 916.

Figure 26A:
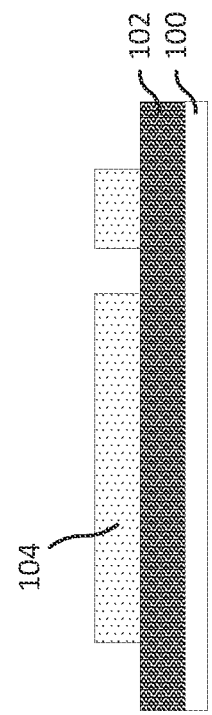
Figure 26B:
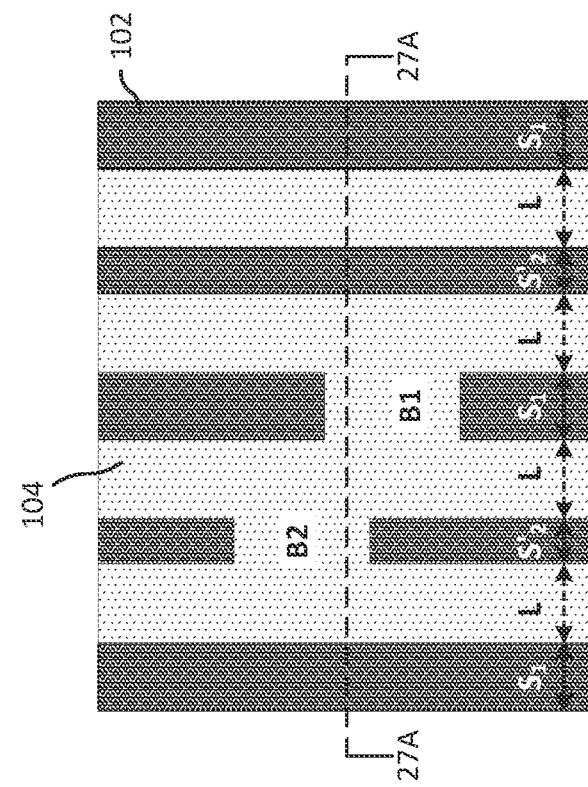

As illustrated in FIGS. 26A and 26B, after the recess etch used in forming the second fill layer 920' is complete, the spacers 302, the first blocks 602, the conformal liner 904, and the second blocks 916 are removed selectively to expose the hardmask layer 104, while the underlying layer 102 remains covered by the hardmask layer 104 and the second fill layer 920' (same as done in flow A).

Figure 27A:
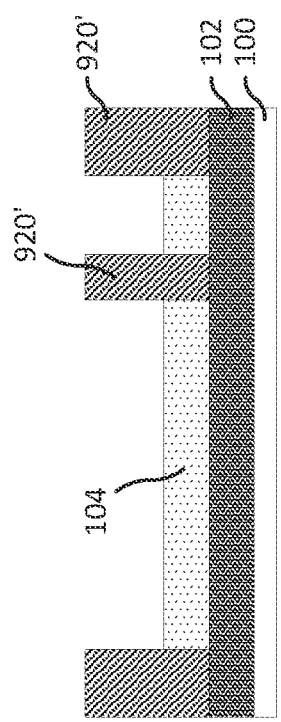
Figure 27B:
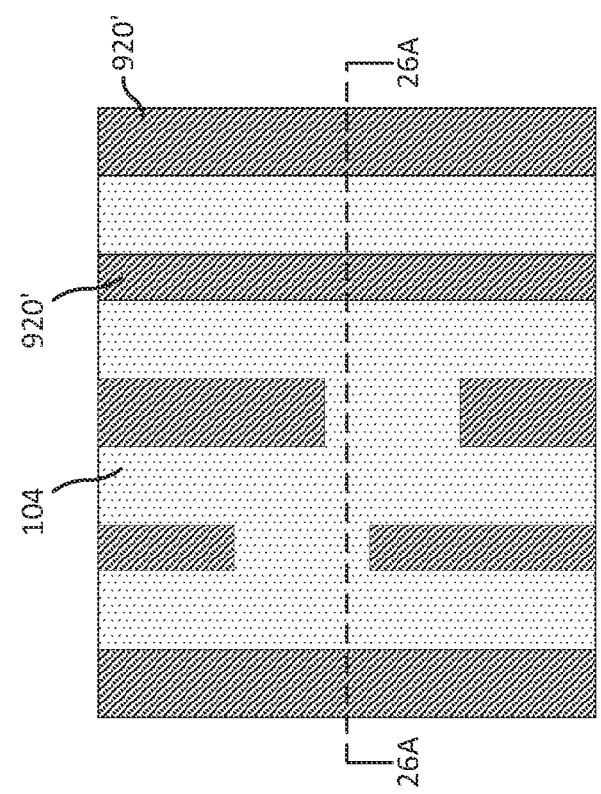

In FIGS. 27A and 27B, the second fill layer 920' has been selectively removed exposing a relief pattern comprising the hardmask trenches (the first hardmask trenches 702' and the second hardmask trenches 919') patterned in the hardmask layer 104. The hardmask layer 104 in the resulting structure, as illustrated in FIGS. 27A and 27B, is same as that illustrated in FIGS. 18A and 18B and, as mentioned above, it may be used as an etch mask to transfer the relief pattern to form a respective pattern of trenches in the underlying layer 102.

Figure 28:
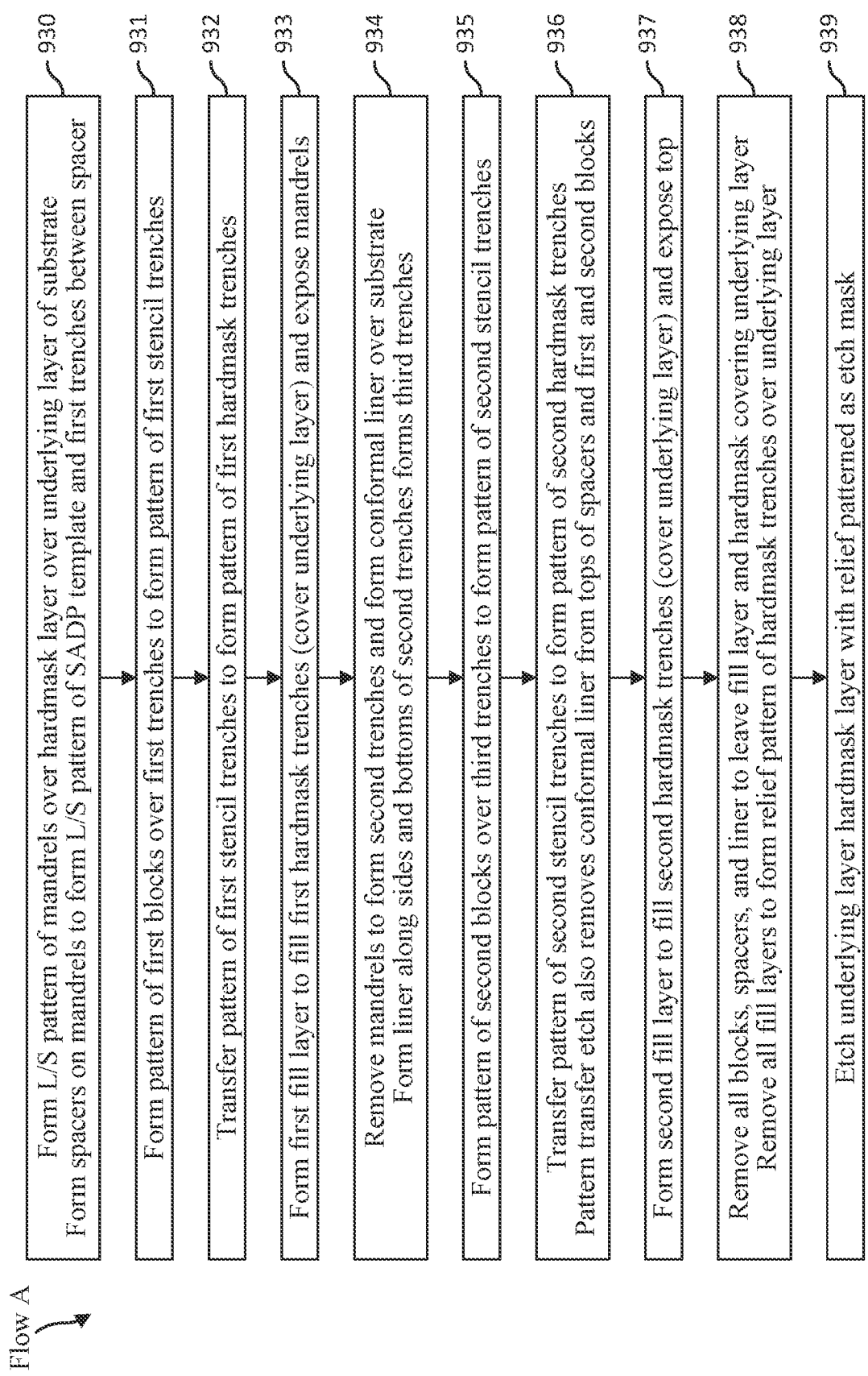
FIG. 28 illustrates a flow chart for the embodiment illustrated in FIGS. 1A-18B.

A flowchart illustrated in FIG. 28 summarizes the process flow A.

As indicated in box 930 in the flowchart for flow A, an L/S pattern of mandrels is formed over a hardmask layer, where the hardmask layer has been formed over an underlying layer of a substrate. Spacers are formed on the mandrels to form a L/S pattern of SADP template lines and first trenches between the template lines (see FIGS. 1A-3B).

In box 931, a pattern of first blocks is formed over the first trenches. Each first block of the pattern of first blocks divides a first trench into segments to form a pattern of first stencil trenches (see FIGS. 4A-6B).

In box 932, an etch process is performed, in which the pattern of first stencil trenches is transferred to the hardmask layer to form a pattern first hardmask trenches (see FIGS. 7A-7B).

A first fill layer is formed that fills the first hardmask trenches to cover an exposed underlying layer, while exposing the mandrels, as indicated in box 933 (see FIGS. 8A-8B).

In box 934, the mandrels are removed to form second trenches, and a conformal liner is deposited over the substrate that forms along the sides of the second trenches to form a pattern of third trenches (see FIGS. 9A-10B).

In box 935, a pattern of second blocks is formed over the third trenches to form a pattern of second stencil trenches (see FIGS. 11A-13B).

The pattern of second stencil trenches is transferred to the hardmask layer, as indicated in box 936. The pattern-transfer etch forms a pattern of second hardmask trenches and may also remove the conformal liner over the spacers and the first and second blocks (see FIGS. 14A-14B).

In box 937, a second fill layer is formed filling the second hardmask trenches and covering the underlying layer at the bottom of the second hardmask trenches. The surface of the second fill layer is recessed to expose the top surfaces of the first and second blocks, the spacers, and the liner that remained along the sides of the second stencil trenches (see FIGS. 15A-16B).

In box 938, the first and second blocks, the spacers, and the liner are removed and, after the removing is complete, removing the second and the first fill layers (see FIGS. 17A-18B).

The relief pattern formed by removing the fill layers comprises the pattern of the first hardmask trenches and the second hardmask trenches. The patterned hardmask layer, having this relief pattern may be used as an etch mask to etch the underlying layer, as indicated in box 939 in FIG. 28.

Figure 29:
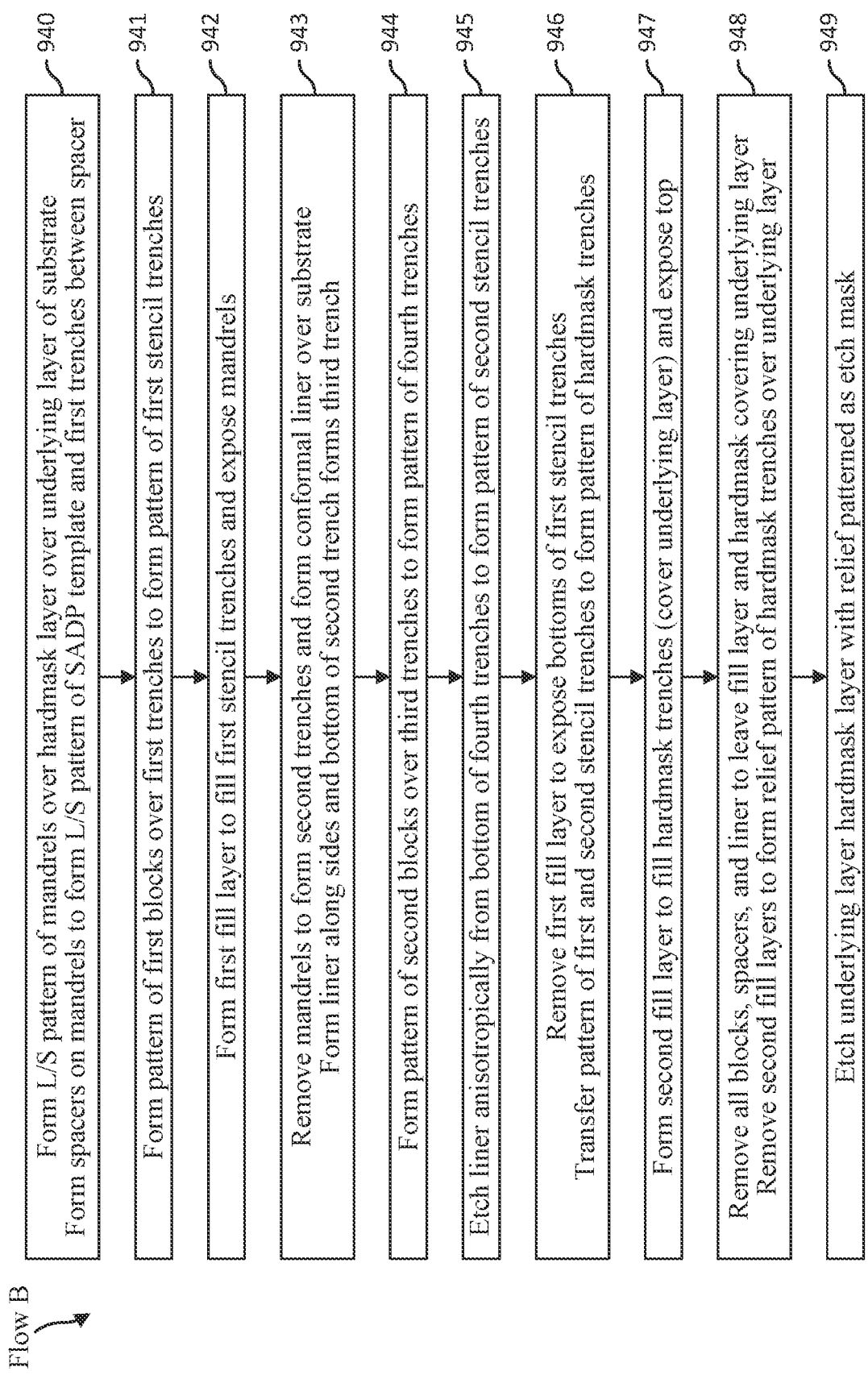
FIG. 29 illustrates a flow chart for the embodiment illustrated in FIGS. 19A-27B.

FIG. 29 illustrates a flowchart for flow B. As mentioned above, flow A and flow B have a common group of process steps. The processing in boxes 940 and 941 are same as in boxes 930 and 931. However, in the following step, a pattern transfer etch forming first hardmask trenches that is performed in flow A (box 932) is skipped in flow B. The process flow in flow B proceeds with forming a first fill layer (box 942) filling the first stencil trenches (see FIGS. 19A-19B), removing mandrels to form second trenches and forming a conformal liner in the second trenches to form third trenches (box 943), and forming a pattern of second blocks to form fourth trenches (see box 944 and FIGS. 20A-20B). The processing indicated in boxes 942, 943, and 944 are the same as in boxes 933, 934, and 935 in flow A.

The fourth trenches formed in flow B after completing the processing in box 944 are same as the second stencil trenches formed in flow A after completing the processing in box 935. However, the fourth trenches are not used as second stencil trenches in flow B. As indicated in box 945 in FIG. 29, in flow B, an anisotropic etch is used to etch the liner at the bottom of the fourth trenches to form a pattern of second stencil trenches (see FIGS. 21A-21B).

After the etch process to form the pattern of second stencil trenches is complete, the first fill layer is removed, and, after removing the first fill layer, an etch process that etches the hardmask layer is performed to form a pattern of hardmask trenches in the hardmask layer, as indicated in box 946 (see FIGS. 22A-23B). With the first fill layer removed, a portion of the hardmask layer is exposed at the bottoms of the first stencil trenches and the bottoms of the second stencil trenches. Thus the etch process in box 946 transfers the patterns of the first stencil trenches and the pattern of the second stencil trenches to simultaneously form a first group of first hardmask trenches and a second group of second hardmask trenches in the hardmask layer.

The processing in box 947 of the flowchart for flow B, forms a second fill layer filling the hardmask trenches to cover the exposed underlying layer and position a surface of the second fill layer with a recess etch (see FIGS. 24A-25B), same as what is done in box 937 of the flowchart for flow A.

The etch processes in box 948 and 949 in the flowchart for flow B (FIG. 29) may be the same as the respective processes in boxes 938 and 939 in the flowchart for flow A (FIG. 28).

In flow B, a relief pattern in the hardmask layer is formed by removing the first and second blocks, the spacers, and the liner and, after the removing is complete, removing the second fill layer (see FIGS. 26A-27B), as indicated in box 948. Although in flow A, the first fill layer is removed (in addition to the second fill layer) by the processing indicated in box 938, the first fill layer and the second fill layer may have the same material composition. Hence, the same etch process may be used in both flow A and flow B to remove the first and the second fill layers.

In box 949 in flow B (and in box 939 in flow A) the relief pattern in the patterned hardmask layer is used to etch the underlying layer.

Figure 30:
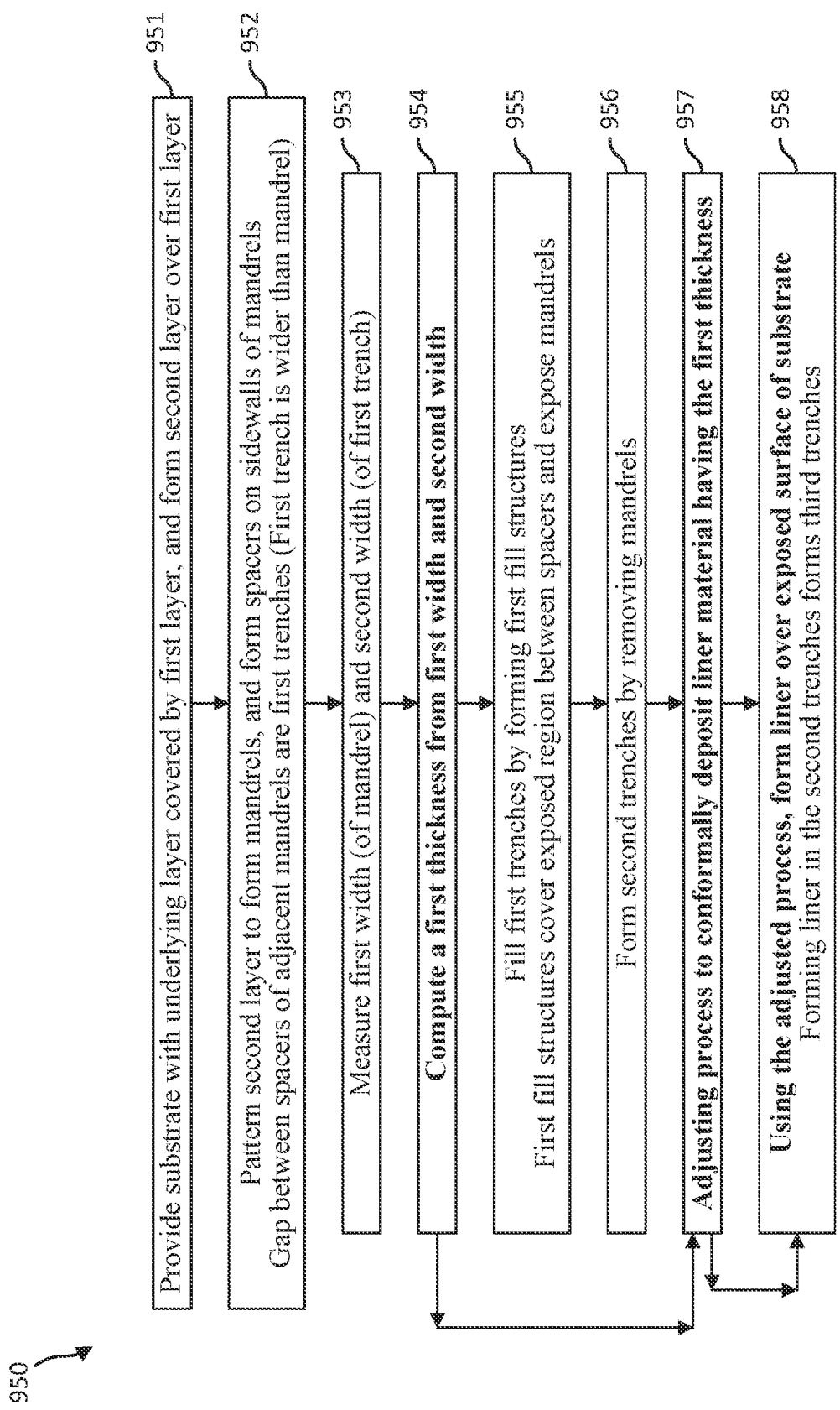
FIG. 30 illustrates a flow chart of a method of forming a semiconductor device that includes a feed-forward process control method to reduce pitch walking, in accordance with some embodiments.

A method 950 for feed-forward process control to reduce pitch walking is described using a flowchart illustrated in FIG. 30.

Pitch walking is an undesirable phenomenon where the pitch in an L/S pattern formed by double patterning is nonuniform. As explained above, in a conventional SADP method using mandrels with self-aligned sidewall spacer as the SADP template lines, pitch walking occurs if a width of the trenches formed by removing the mandrels, $S_2=W_M$, is not the same as the width of the trenches between the spacers of adjacent mandrels, $S_1=P_M-(W_M+2L)$. As mentioned above, $W_M$ is the mandrel width, $P_M$ is the mandrel pitch of an L/S pattern of mandrels, and L is the width of each spacer. In the embodiments of the SADP process flows, flow A and flow B, described above, a feed-forward process control method, for example, method 950 may be applied, to utilize the thickness of the conformal liner $T_L$ to adjust the space, $S_2=W_M$, to $S'_2=(S_2-2T_L)$.

In FIG. 30, box 951 of the method 950 indicates that a substrate is provided having an underlying layer covered by a first layer. A second layer is formed over the first layer.

In box 952, the second layer is patterned to form mandrels, and spacers are formed on the sidewalls to form a pattern of first trenches, where each of the first trenches is a gap between the spacers of adjacent mandrels. In the method 950, the pattern of mandrels and the width of the spacers have been designed for the mandrels to be wider than the first trenches. The underlying layer, the first layer, the second layer, and the first trenches may be similar to the underlying layer 102, the hardmask layer 104, the mandrels 106, and the first trenches 304, respectively, in flow A and flow B, described above.

In box 953, the L/S pattern of mandrels and spacers (lines) and first trenches (spaces) are inspected to measure a first width of the mandrels and a second width of the first trenches.

As indicated in box 954, a first thickness is computed from the measured first width and second width. In one embodiment, the first width is computed to be equal to half the result of the first width minus the second width.

In box 955, the first trenches are filled by forming first fill structures. The first fill structures may be covering an exposed region between adjacent spacers and exposing the mandrels.

The first fill structures filling first trenches may be similar to the first blocks 602, and the first fill layer 802 (flow A) or first fill layer 802' (flow B). The first fill structures may be formed by filling a first portion of the first trenches with a first material (e.g., the material used to form the first blocks 602). The remaining portion, i.e., a second portion of the first trenches, may be filled with a second material (e.g., the material used to form the first fill layer 802 (flow A) or the first fill layer 802' (flow B).

A mandrel-pull etch step may be performed to selectively remove the mandrels, forming second trenches, as indicated in box 956.

In box 957, a suitable deposition process (e.g. an ALD process) is adjusted to conformally deposit a material having the first thickness (computed in box 954).

In box 958, the adjusted process is used to form a liner over an exposed surface of the substrate. Forming the liner in the second trenches forms third trenches. The second trenches, the liner, and the third trenches may be similar to the second trenches 902, the conformal liner 904, and the third trenches 906 in flow A and flow B, described above.

A first portion of the third trenches may be filled by forming second fill structures (e.g., the second blocks 916 in flow A and flow B), the remaining portion being a second portion of the third trenches.

The first layer (e.g., the hardmask layer 104) may be patterned with a relief pattern of fourth trenches. The fourth trenches consist of a first group of fourth trenches and a second group of fourth trenches formed in the first layer. The first group of fourth trenches may be formed by extending the second portion of the first trenches, and the second group of fourth trenches may be formed by extending the second portion of the third trenches. The fourth trenches may be the hardmask trenches in flow A and flow B. The first group of fourth trenches are similar to the first hardmask trenches 702 or the first hardmask trenches 702' in flow A and flow B, respectively. The second group of fourth trenches are similar to the second hardmask trenches 919 or the second hardmask trenches 919' in flow A and flow B, respectively.

The pattern of fourth trenches may be transferred to form a pattern of fifth trenches in the underlying layer by etching the underlying layer using the first layer as an etch mask.

The embodiments of double patterning methods described above provide several advantages.

The patterned layer may achieve a lower EPE by reducing pitch walking. The method to reduce pitch walking may incorporate a feed-forward process control technique that may adjust the patterning from run to run to further improve the pitch uniformity in double patterning.

In the method to reduce pitch walking, the mandrels are patterned wider than the gap between spacers of adjacent mandrels, whereas the respective SADP method that does not use the conformal liner used in the embodiments described above, the mandrels are patterned to match the gap between spacers of adjacent mandrels. Hence, the mandrels are patterned wider using the embodiments described in this disclosure. As known to persons skilled in the art, wider resist lines in a dense L/S pattern exhibit less line edge roughness (LER) and linewidth roughness (LWR).

The invented methods alleviates the complexity of the selective etch processes used in the process flows for self-aligned double patterning (SADP) with a double patter of self-aligned blocks (SAB) by having fewer types of materials exposed during etching. For example, the underlying layer is not exposed while the pattern of spacers and the patterns of first blocks and second blocks are stripped.

Example embodiments of the invention are summarized here. Other embodiments can also be understood from the entirety of the specification as well as the claims filed herein.

Example 1. A method of forming a semiconductor device, where the method includes: forming, over a hardmask layer and an underlying layer of a substrate, a pattern of first trenches between adjacent template lines, each of the first trenches exposing a portion of the hardmask layer, and each of the template lines including a mandrel and spacers on sidewalls of the mandrel; forming a pattern of first blocks over the pattern of the first trenches and the template lines, the first blocks dividing the first trenches to form a pattern of first stencil trenches; transferring the pattern of first stencil trenches to the hardmask layer to form a pattern of first hardmask trenches, each of the first hardmask trenches exposing a portion of the underlying layer; forming a first fill layer filling the first hardmask trenches and exposing the mandrels; selectively removing the mandrels to form second trenches, each of the second trenches exposing a portion of the hardmask layer; and forming a conformal liner in the second trenches and over a surface of the spacers, a surface of the first blocks, and a surface of the first fill layer to form third trenches.

Example 2. The method of example 1, further including: etching a pattern in the underlying layer using a pattern-transfer etch, where the pattern-transfer etch uses the hardmask layer as an etch mask, the hardmask layer having a relief pattern including the pattern of first hardmask trenches and a pattern of second hardmask trenches.

Example 3. The method of one of examples 1 or 2, where the underlying layer, the hardmask layer, the mandrels, the spacers, the first blocks, the first fill layer, and the conformal liner include silicon, silicon oxide, amorphous silicon, silicon nitride, metal oxide, metal nitride, and metal, respectively.

Example 4. The method of one of examples 1 to 3, where forming the conformal liner includes performing an atomic layer deposition (ALD) process.

Example 5. The method of one of examples 1 to 4, where forming the first fill layer includes: overfilling the first hardmask trenches with a first fill material; and performing a recess etch to form the first fill layer, where the recess etch places a surface of the first fill layer above the hardmask layer.

Example 6. The method of one of examples 1 to 5, further including: using a lithography process, forming a pattern of second blocks over the third trenches, where each of the second blocks is filling a portion of the third trenches, the unfilled portions being a pattern of second stencil trenches; transferring the pattern of second stencil trenches to the hardmask layer to form the pattern of second hardmask trenches; forming a relief pattern including the first hardmask trenches and the second hardmask trenches in the hardmask layer, where the relief pattern includes an L/S pattern having a pitch that is less than a patterning limit of the lithography process; and etching a pattern in the underlying layer based on the relief pattern in the hardmask layer.

Example 7. The method of one of examples 1 to 6, where transferring the pattern of second stencil trenches to the hardmask layer removes the conformal liner from over the surface of the spacers, the surface of the first blocks, the surface of the first fill layer, and a bottomwall of the second stencil trenches.

Example 8. The method of one of examples 1 to 7, where a space between a first block and an adjacent second block is less than a patterning limit of the lithography process.

Example 9. The method of one of examples 1 to 8, where the first blocks and the second blocks have the same composition.

Example 10. The method of one of examples 1 to 9, further including: prior to etching the pattern in the underlying layer, forming a second fill layer filling the second hardmask trenches, the second fill layer, the first fill layer, and the hardmask layer covering the underlying layer and exposing all other layers above the hardmask layer; with the underlying layer covered by the hardmask layer, the first fill layer, and the second fill layer, selectively removing all other layers above the hardmask layer; selectively removing the second fill layer and the first fill layer to form the relief pattern.

Example 11. The method of one of examples 1 to 10, where the first fill layer and the second fill layer have the same composition.

Example 12. The method of one of examples 1 to 11, where the first fill layer and the second fill layer includes spin-on carbon (SOC).

Example 13. A method of forming a semiconductor device, where the method includes: forming a hardmask layer over an underlying layer of a substrate; using a lithography process, patterning a mandrel layer formed over the hardmask layer to form a pattern of mandrels; forming spacers on sidewalls of the mandrels and first trenches between spacers of adjacent mandrels; forming, over the first trenches, a pattern of first blocks exposing the mandrels and filling a portion of the first trenches, the unfilled portion defining a pattern of first stencil trenches; forming a first fill layer to fill the first stencil trenches and exposing the mandrels; selectively removing the mandrels to form second trenches; forming, over an exposed surface of the substrate, a conformal liner to form a pattern of third trenches, where the liner being formed in the second trenches forms the third trenches.

Example 14. The method of example 13, further including: transferring a relief pattern in the hardmask layer to the underlying layer by performing an etch process, where the etch process uses the hardmask layer as an etch mask.

Example 15. The method of one of examples 13 or 14, where forming the relief pattern includes: forming a pattern of second stencil trenches each of the second stencil trenches having a bottom exposing a portion of the hardmask layer and sides covered by the liner; selectively removing the first fill layer to expose the bottoms of the first stencil trenches; forming a pattern of hardmask trenches by transferring the pattern of first stencil trenches and the pattern of second stencil trenches to the hardmask layer; forming a second fill layer filling the hardmask trenches and exposing the surface of the spacers, the surface of the first blocks, the surface of the conformal liner, and the surface of the second blocks; and selectively removing the second fill layer to form the relief pattern in the hardmask layer, the relief pattern including an L/S pattern of hardmask trenches having a pitch that is less than a patterning limit of the lithography process.

Example 16. The method of one of examples 13 to 15, where forming the pattern of second stencil trenches includes: forming, over the third trenches, a pattern of second blocks filling a portion of the third trenches, the unfilled portions being a pattern of fourth trenches; and removing the liner from bottoms of the fourth trenches; and where the method further includes: forming a second fill layer filling the hardmask trenches and exposing the surface of the spacers, the surface of the first blocks, the surface of the conformal liner, and the surface of the second blocks; and prior to selectively removing the second fill layer, selectively removing the spacers, the first blocks, the conformal liner, and the second blocks to expose the hardmask layer, where, after the removing is complete, the underlying layer is covered by the hardmask layer and the second fill layer.

Example 17. A method of forming a semiconductor device, where the method includes: providing a substrate having an underlying layer covered by a first layer and a second layer formed over the first layer; patterning the second layer to form a pattern of mandrels; forming spacers on sidewalls of the mandrels to form first trenches between spacers of adjacent mandrels, the mandrels being wider than the first trenches; measuring a first width of the mandrels and a second width of the first trenches; computing a first thickness from the measured first width and second width; filling the first trenches by forming first fill structures, the first fill structures covering an exposed region between adjacent spacers and exposing the mandrels; forming second trenches by selectively removing the mandrels; adjusting a process to conformally deposit a liner material having the first thickness; and using the adjusted process, forming a liner over an exposed surface of the substrate, where forming the liner in the second trenches forms third trenches.

Example 18. The method of example 17, further including: forming fifth trenches by etching the underlying layer using the first layer as an etch mask, the etch transferring a pattern of fourth trenches consisting of a first group of fourth trenches and a second group of fourth trenches formed in the first layer.

Example 19. The method of one of examples 17 or 18, where the first thickness is computed to be equal to half the result of the first width minus the second width.

Example 20. The method of one of examples 17 to 19, where forming first fill structures includes: filling a first portion of the first trenches with a first material, the remaining portion being a second portion of the first trenches; and filling the second portion of the first trenches with a second material; and where the method further includes: filling a first portion of the third trenches by forming second fill structures, the remaining portion being a second portion of the third trenches; and forming, in the first layer, a first group of fourth trenches by extending the second portion of the first trenches, and a second group of fourth trenches by extending the second portion of the third trenches.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a semiconductor device, the method comprising:
    forming, over a hardmask layer and an underlying layer of a substrate, a pattern of first trenches between adjacent template lines, each of the first trenches exposing a portion of the hardmask layer, and each of the template lines comprising a mandrel and spacers on sidewalls of the mandrel;
    forming a pattern of first blocks over the pattern of the first trenches and the template lines, the first blocks dividing the first trenches to form a pattern of first stencil trenches;
    transferring the pattern of first stencil trenches to the hardmask layer to form a pattern of first hardmask trenches, each of the first hardmask trenches exposing a portion of the underlying layer;
    forming a first fill layer filling the first hardmask trenches and exposing the mandrels;
    selectively removing the mandrels to form second trenches, each of the second trenches exposing a portion of the hardmask layer; and
    forming a conformal liner in the second trenches and over a surface of the spacers, a surface of the first blocks, and a surface of the first fill layer to form third trenches.

2. The method of claim 1, further comprising:
    etching a pattern in the underlying layer using a pattern-transfer etch, wherein the pattern-transfer etch uses the hardmask layer as an etch mask, the hardmask layer having a relief pattern comprising the pattern of first hardmask trenches and a pattern of second hardmask trenches.

3. The method of claim 1, wherein the underlying layer, the hardmask layer, the mandrels, the spacers, the first blocks, the first fill layer, and the conformal liner comprise silicon, silicon oxide, amorphous silicon, silicon nitride, metal oxide, metal nitride, and metal, respectively.

4. The method of claim 1, wherein forming the conformal liner comprises performing an atomic layer deposition (ALD) process.

5. The method of claim 1, wherein forming the first fill layer comprises:
- overfilling the first hardmask trenches with a first fill material; and
- performing a recess etch to form the first fill layer, wherein the recess etch places a surface of the first fill layer above the hardmask layer.

6. The method of claim 1, further comprising:
- using a lithography process, forming a pattern of second blocks over the third trenches, wherein each of the second blocks is filling a portion of the third trenches, unfilled portions of the third trenches being a pattern of second stencil trenches;
- transferring the pattern of second stencil trenches to the hardmask layer to form the pattern of second hardmask trenches;
- forming a relief pattern comprising the first hardmask trenches and the second hardmask trenches in the hardmask layer, wherein the relief pattern comprises an L/S pattern having a pitch that is less than a patterning limit of the lithography process; and
- etching a pattern in the underlying layer based on the relief pattern in the hardmask layer.

7. The method of claim 6, wherein transferring the pattern of second stencil trenches to the hardmask layer removes the conformal liner from over the surface of the spacers, the surface of the first blocks, the surface of the first fill layer, and a bottomwall of the second stencil trenches.

8. The method of claim 6, wherein a space between one of the first blocks and an adjacent one of the second blocks is less than a patterning limit of the lithography process.

9. The method of claim 6, wherein the first blocks and the second blocks have the same composition.

10. The method of claim 6, further comprising:
- prior to etching the pattern in the underlying layer, forming a second fill layer filling the second hardmask trenches, the second fill layer, the first fill layer, and the hardmask layer covering the underlying layer and exposing all other layers above the hardmask layer;
- with the underlying layer covered by the hardmask layer, the first fill layer, and the second fill layer, selectively removing all other layers above the hardmask layer; and
- selectively removing the second fill layer and the first fill layer to form the relief pattern.

11. The method of claim 10, wherein the first fill layer and the second fill layer have the same composition.

12. The method of claim 10, wherein the first fill layer and the second fill layer comprise spin-on carbon (SOC).

13. A method of forming a semiconductor device, the method comprising:
- forming a hardmask layer over an underlying layer of a substrate;
- forming template lines over the hardmask layer, adjacent template lines being separated by a pattern of first trenches, each of the first trenches exposing a portion of the hardmask layer, and each of the template lines comprising a mandrel and spacers on sidewalls of the mandrel;
- forming a pattern of first blocks over the pattern of the first trenches and the template lines, the first blocks dividing the first trenches to form a pattern of first stencil trenches;
- etching the hardmask layer through the first stencil trenches to form a pattern of first hardmask trenches, each of the first hardmask trenches exposing a portion of the underlying layer;
- depositing a first fill layer in the first hardmask trenches, a top surface of the first fill layer being below a top surface of the mandrels, a top surface of the spacers, and a top surface of the first blocks;
- selectively etching the mandrels to form second trenches, each of the second trenches exposing a portion of the hardmask layer; and
- depositing a conformal liner in the second trenches and over the top surface of the spacers, the top surface of the first blocks, and the top surface of the first fill layer to form third trenches.

14. The method of claim 13, further comprising:
- forming a pattern of second blocks over the third trenches, the second blocks dividing the third trenches to form a pattern of second stencil trenches;
- etching the hardmask layer though the second stencil trenches to form a pattern of second hardmask trenches, wherein the pattern of first hardmask trenches and the pattern of second hardmask trenches form a relief pattern in the hardmask layer; and
- transferring the relief pattern in the hardmask layer to the underlying layer.

15. The method of claim 14, wherein the first blocks and the second blocks have the same composition.

16. The method of claim 14, wherein transferring the relief pattern in the hardmask layer to the underlying layer comprises performing an etch process, wherein the etch process uses the hardmask layer as an etch mask.

* * * * *